United States Patent [19]

Momma et al.

[11] Patent Number: 5,561,317
[45] Date of Patent: Oct. 1, 1996

[54] METHOD OF MANUFACTURING SEMICONDUCTOR DEVICES

[75] Inventors: Genzo Momma, Hiratsuka; Hiroshi Yuzurihara, Isehara, both of Japan

[73] Assignee: Canon Kabushiki Kaisha, Tokyo, Japan

[21] Appl. No.: 478,447

[22] Filed: Jun. 7, 1995

Related U.S. Application Data

[62] Division of Ser. No. 395,183, Feb. 27, 1995, which is a continuation of Ser. No. 750,033, Aug. 23, 1991, abandoned.

[30] Foreign Application Priority Data

| Aug. 24, 1990 | [JP] | Japan | 2-221000 |
| Nov. 26, 1990 | [JP] | Japan | 2-318071 |
| Aug. 8, 1991 | [JP] | Japan | 3-199274 |

[51] Int. Cl.⁶ ................................. H01L 23/544
[52] U.S. Cl. ................ 257/620; 257/431; 257/565; 257/577
[58] Field of Search ................ 257/620, 431, 257/565, 577

*Primary Examiner*—Mark V. Prenty
*Attorney, Agent, or Firm*—Fitzpatrick, Cella, Harper & Scinto

[57] ABSTRACT

Disclosed is a method of manufacturing semiconductor devices in which a desired pattern having an area size larger than the field size that can be obtained in one exposure process step of an exposure device is formed. The manufacturing method includes the steps of dividing the desired pattern into a plurality of portions, and conducting exposure on the dividing patterns in a joined fashion.

4 Claims, 19 Drawing Sheets

FIG. 18
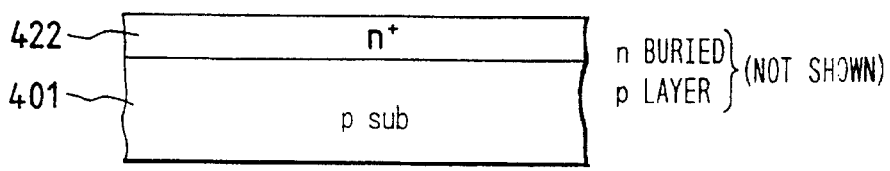
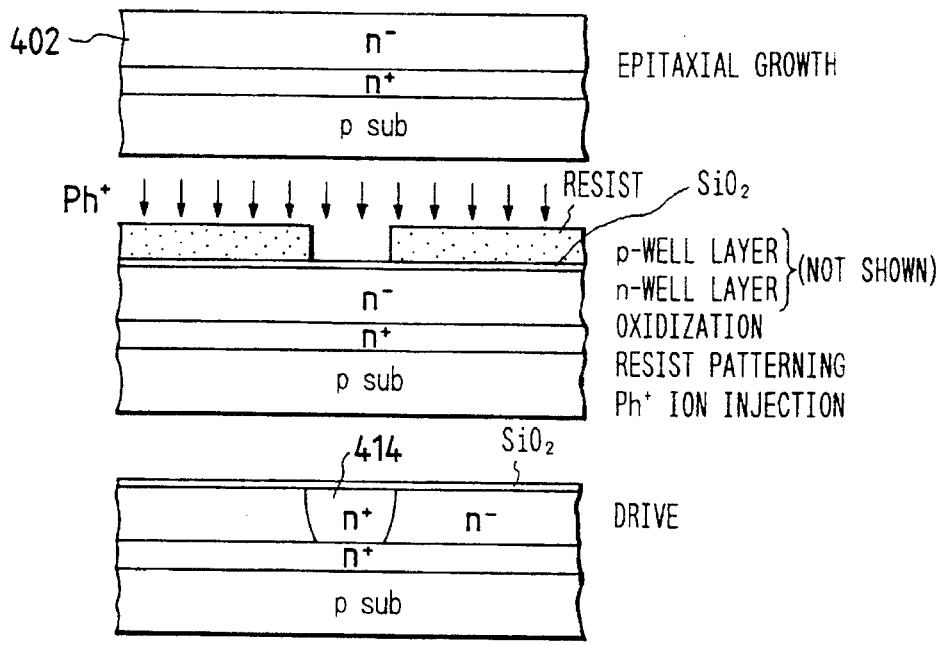
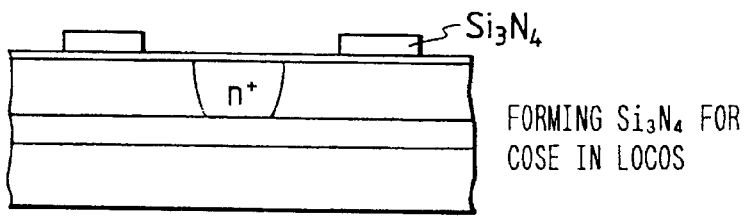
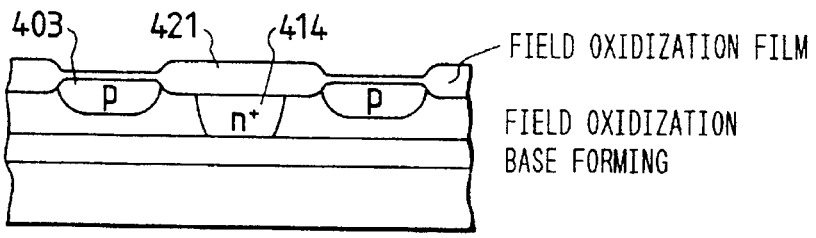

FIG. 22
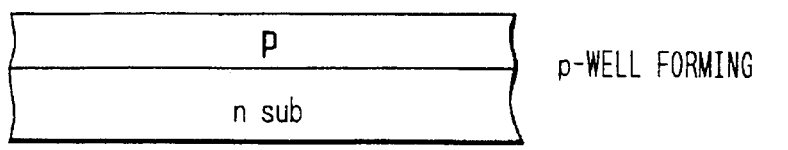
p-WELL FORMING
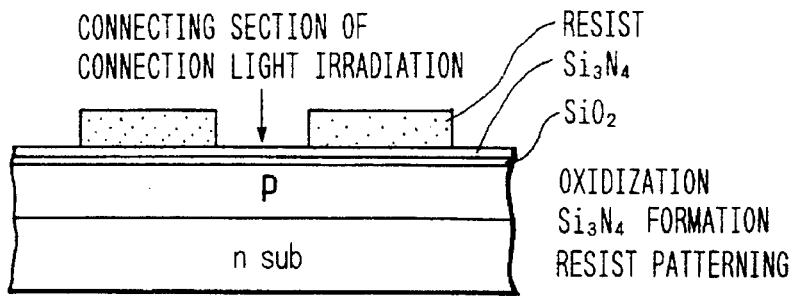
OXIDIZATION
Si₃N₄ FORMATION
RESIST PATTERNING
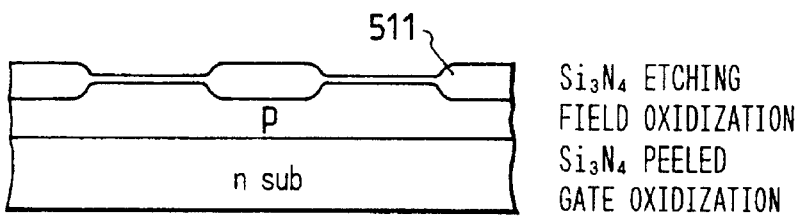
Si₃N₄ ETCHING
FIELD OXIDIZATION
Si₃N₄ PEELED
GATE OXIDIZATION
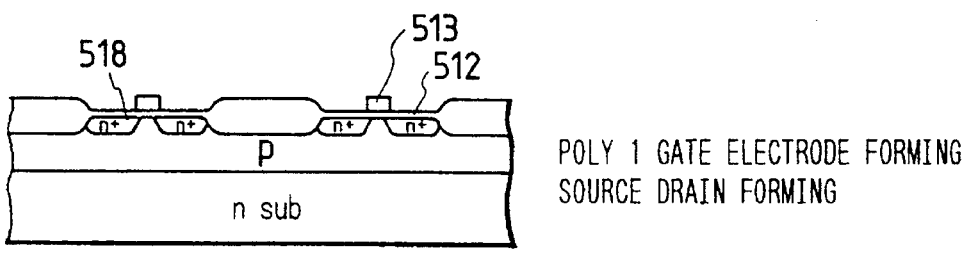
POLY 1 GATE ELECTRODE FORMING
SOURCE DRAIN FORMING
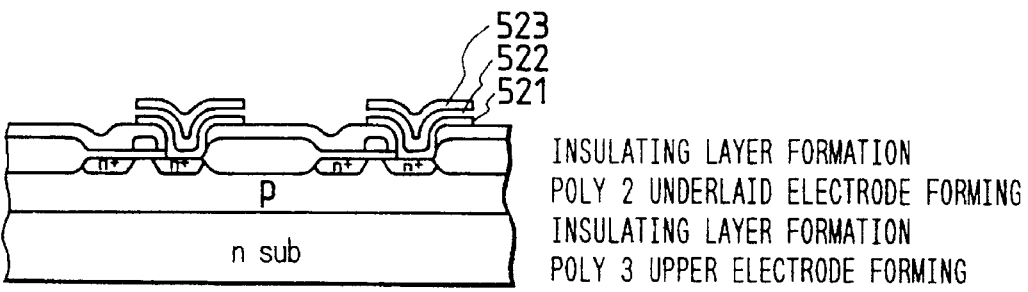
INSULATING LAYER FORMATION
POLY 2 UNDERLAID ELECTRODE FORMING
INSULATING LAYER FORMATION
POLY 3 UPPER ELECTRODE FORMING
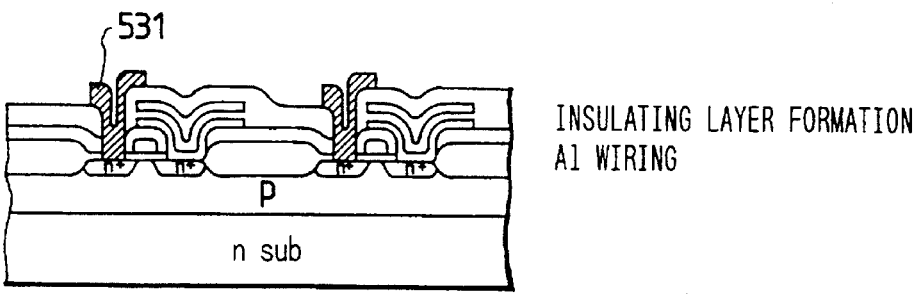
INSULATING LAYER FORMATION
Al WIRING

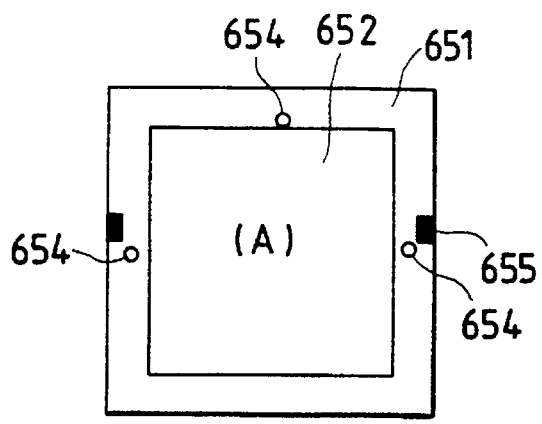
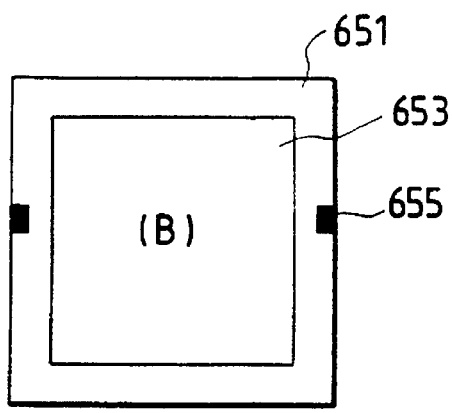
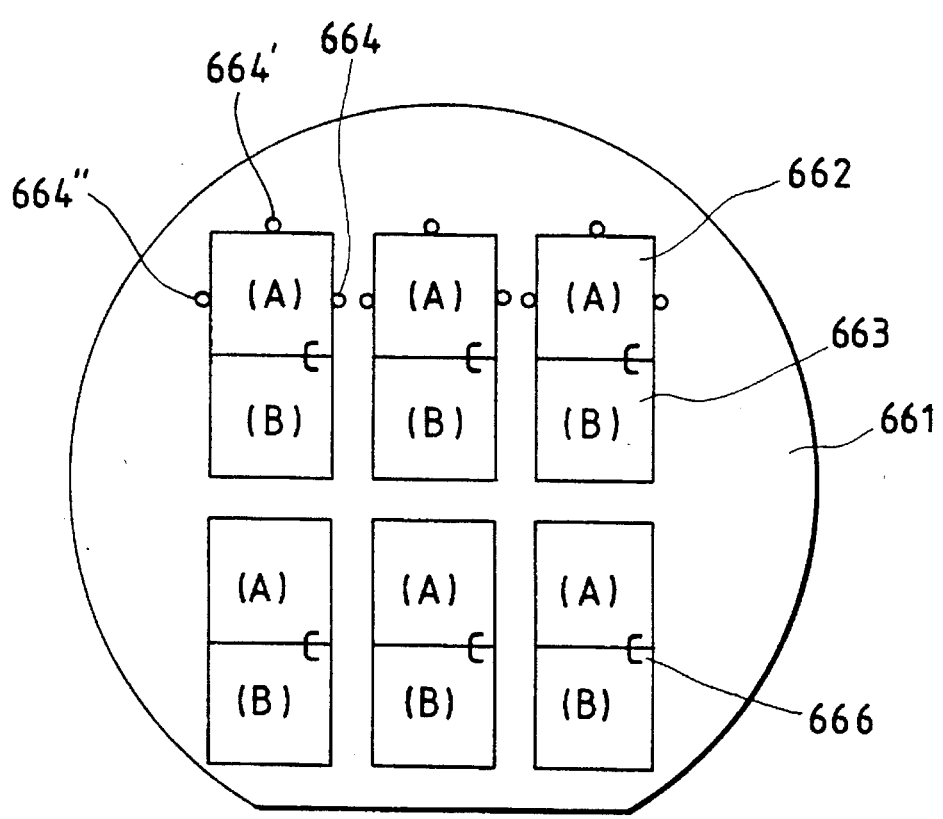

5,561,317

METHOD OF MANUFACTURING SEMICONDUCTOR DEVICES

This application is a division of application Ser. No. 08/395,183 filed Feb. 27, 1995, which is a continuation of application Ser. No. 07/750,033 filed Aug. 23, 1991, now abandoned.

BACKGROUND OF THE INVENTION

1. Field of the Invention

The present invention relates to a method of manufacturing semiconductor devices, and more particularly, to a method of manufacturing semiconductor devices in each of which a circuit pattern having a size larger than the field size that can be obtained by one exposure operation of a reduction projection exposure device is formed on a semiconductor substrate.

2. Related Barkground Art

In a conventional semiconductor device manufacturing method, semiconductor devices having a large chip size are formed on semiconductor substrates utilizing the equal size projection technique, which is accomplished by the use of, for example, a reflection type projection exposure device. A reduction projection exposure device has not been used.

In conventional semiconductor devices, a single IC chip generally has a single major function, e.g., a microcomputer or memory function, because provision of a plurality of sufficient functions in a single IC chip increases the chip size greatly. Provision of an IC chip having a pattern containing a plurality of functions requires the reduction projection exposure technique which is capable of projecting an area larger than that which can be projected by one operation of the reduction projection exposure device. It is therefore impossible to form a circuit pattern in which a plurality of sufficient functions are formed in an area which can be projected by one exposure process step.

In recent years, the chip size has been increased and the pattern size has become fine. Regarding this, the use of a reflection type projection exposure device arouses various problems. Such problems will be described in detail with reference to FIG. 1 which shows an example of a reflection type projection exposure device.

The reflection type projection exposure device has an optical system which includes a combination of concave mirror 11 and a convex mirror 12 and which employs an arcuate slit-shaped illumination 13. In this device, an image of the pattern on the mask 14 is transferred on the entire surface of the wafer 15 at a projection ratio of 1:1 by synchronously moving a mask 14 and a wafer 15 in the direction indicated by arrows A in FIG. 1. When it is desired to manufacture semiconductor devices having a large chip size, the mask pattern can be transferred onto the wafer 15 using a mask having a pattern whose size is the same as the chip size. This technique achieves resolution of about 2 μm. It is therefore very difficult to form a fine pattern having a design rule of, for example, 0.5 to 1.0 μm and thereby increase the integration density. Since alignment is conducted using alignment marks formed at the right and left sides of a wafer, alignment accuracy is limited to 3σ=1.5 μm. With the reflection projection exposure device of the above-described type, it is therefore impossible to form fine patterns having a design rule of submicron.

In other words, the reflection type projection exposure device, which is used to form IC chips having a size which is the same as the mask size, cannot cope with the increasing demands for forming finer patterns in terms of the resolution and alignment accuracy.

Furthermore, when the above-described type of exposure device is used, distortion of the hardware deteriorates the degree of orthogonalization of a formed pattern and automatic alignment accuracy between the adjoining manufacturing processes is limited to 3σ≅1.5 μm. These preclude the exposure device from coping with formation of patterns having a design rule of submicron.

That is, when semiconductor devices having a large chip size are manufactured, the use of the reflection type projection exposure device has the following drawbacks.

(1) Since the resolution achieved by the exposure device is 2.5 to 3 μm, it is impossible to form fine patterns having a design rule of, for example, 0.5 to 1.0 μm and thereby increase the integration density.

(2) Distortion of the hardware deteriorates the degree of orthogonalization of the pattern.

(3) Since automatic alignment accuracy between the processes is 3σ≅1.5 μm, it is impossible to cope with demands for forming fine patterns having a design rule of submicron.

To improve the resolution or alignment accuracy, a reduction projection exposure device may be used. As shown in FIG. 2 which illustrates an example of a reduction projection exposure device, in the reduction projection exposure device, the image of a pattern formed on a reticle is demagnified at a demagnification ratio inherent in a reduction projection lens 23 and projected onto a wafer 27. After the exposure of one shot, the wafer is moved or stepped on an XY stage 28, and the process is repeated. This step-and-repeat projection exposure technique achieves approximately 1.0 μm resolution. Since alignment is conducted after exposure of each shot, alignment accuracy of 3σ≅0.2 is achieved.

When semiconductor devices having a large chip size are formed using the reduction projection exposure device, it is considered to use a lens not having a demagnification ratio of 5:1 or 10:1 but a demagnification ratio of 2.5:1. In that case, the exposure area (field size) is practically ⌀40 mm. This is because it is possible to increase the mask size but it is impossible to provide an optical system of the exposure device which is capable of projecting that mask image on a large exposure area without causing distortion or irregularities. It is therefore impossible to manufacture semiconductor devices having a chip size of 50 mm or more and having fine patterns by utilizing the conventional techniques.

SUMMARY OF THE INVENTION

In view of the aforementioned problems of the conventional techniques, a primary object of the present invention is to provide a method of manufacturing semiconductor devices which is capable of manufacturing large semiconductor devices that cannot be manufactured using the aforementioned conventional techniques.

Another object of the present invention is to provide a method of manufacturing semiconductor devices which is capable of forming a desired pattern having an area size larger than the field size that can be obtained in one exposure process step of an exposure device by dividing the desired pattern into a plurality of portions and then by conducting exposure on the divided patterns in a joined fashion.

Another object of the present invention is to provide a method of manufacturing semiconductor devices which is capable of forming on a semiconductor substrate a desired pattern having an area size larger than the field size that can be projected in one exposure process step of a reduction projection type exposure device by repeating the process of projecting a circuit pattern on the semiconductor substrate using the reduction projection type exposure device and thereby sequentially joining the circuit patterns with each other.

Another object of the present invention is to provide a method of manufacturing semiconductor devices which is capable of forming on a semiconductor substrate a desired pattern having an area size larger than the field size that can be projected in one exposure process step of a reduction projection exposure device by repeating the process of projecting a circuit pattern on the semiconductor substrate using the reduction projection type exposure device while sequentially connecting the projected patterns with each other. The connecting portion between the adjacent circuit patterns is double projected to form a double exposure area.

Another object of the present invention is to provide a semiconductor device manufactured by a method of manufacturing semiconductor devices in which a desired pattern having an area size larger than the field size that can be projected in one exposure process step of a reduction projection type exposure device is formed on a semiconductor substrate by repeating the process of projecting a circuit pattern on the semiconductor substrate using the reduction projection type exposure device while sequentially connecting the projected patterns with each other. At least part of the connecting portion is disposed in a device separating area of the semiconductor device.

Another object of the present invention is to provide a method of manufacturing semiconductor devices which is capable of forming on a semiconductor substrate a desired pattern having a size larger than the field size that can be projected in one exposure process step of a reduction projection type exposure device by repeating the process of projecting a circuit pattern on the semiconductor substrate using the reduction projection type exposure device while sequentially connecting the projected patterns with each other. At least part of the connecting portion is present in a device separating area of the semiconductor device.

Another object of the present invention is to provide a method of manufacturing semiconductor devices which is capable of forming on a semiconductor substrate a desired pattern having a size larger than the field size that can be projected in one exposure process step of a reduction projection type exposure device by repeating the process of projecting a circuit pattern on the semiconductor substrate using the reduction projection type exposure device while sequentially connecting the projected patterns with each other. In a plurality of exposure operations, at least one exposure process step is conducted using a reflection projection, proximity or contact exposure device.

BRIEF DESCRIPTION OF THE DRAWINGS

FIGS. 3, 6, 7, 10, 11, 24, 28, 30 and 31 respectively show the pattern of a first layer on a wafer which is used in the embodiments of the present invention;

FIGS. 4, 5, 8, 9, 23, 25, 27, 29A, 29B, 32 and 33 respectively show the pattern of a reticle (mask) used in the embodiments of the present invention;

FIGS. 18 and 22 respectively illustrate a method of manufacturing semiconductor devices according to the embodiments of the present invention;

DETAILED DESCRIPTION OF THE PREFERRED EMBODIMENTS

In the present invention, when a desired pattern is formed, an exposure process step is conducted a plurality of times using patterns obtained by dividing the desired pattern into a plurality of areas, by means of which the divided patterns are connected to form the desired pattern.

Therefore, patterns having a larger area than the effective area of the pattern can be formed, and fine patterns can be formed utilizing the reduction projection exposure technique.

Furthermore, if patterning of the divided patterns is devised, patterns having any size can be formed using less number of masks or divided patterns by repeating exposure using the same divided patterns.

Furthermore, when the connecting portion between the divided patterns corresponds to a device separating or non-forming area, offsets between the divided patterns do not affect the characteristics of the formed device. This increases yield.

Offsets between the divided patterns which would occur during exposure can be compensated for by slightly overlapping the divided patterns.

The desired pattern may be divided according to the function. In that case, changes in the specifications of the individual functions can be readily coped with. Also, division of the desired pattern according to the function readily precludes formation of a device over the divided patterns.

Division of the pattern is conducted only when necessary. If a sufficient patterning accuracy can be obtained in a sufficiently large patterning area, it is not necessary to divide the pattern.

Embodiments of the present invention will now be described below with reference to the accompanying drawings.

[First Embodiment]

Figure 1:
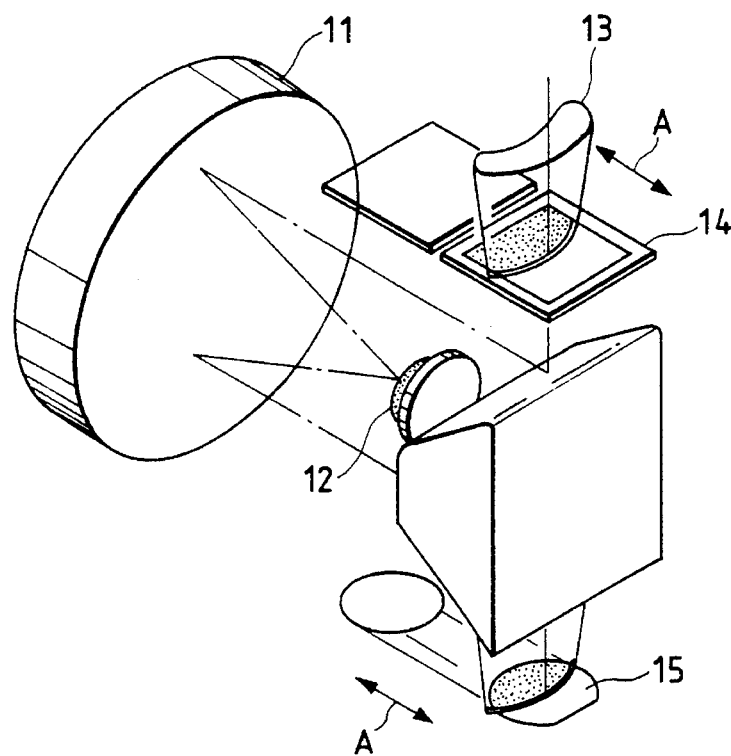
FIG. 1 is a schematic perspective view illustrating one example of a reflection type projection exposure device.
Figure 2:
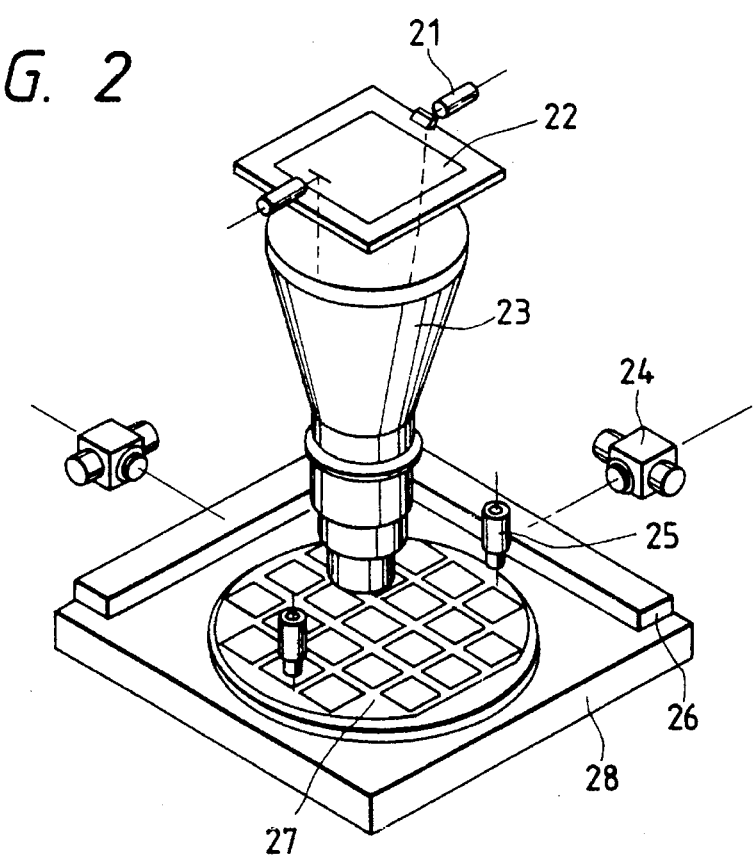
FIG. 2 is a schematic perspective view illustrating one example of a reflection type projection exposure device.
Figure 3:
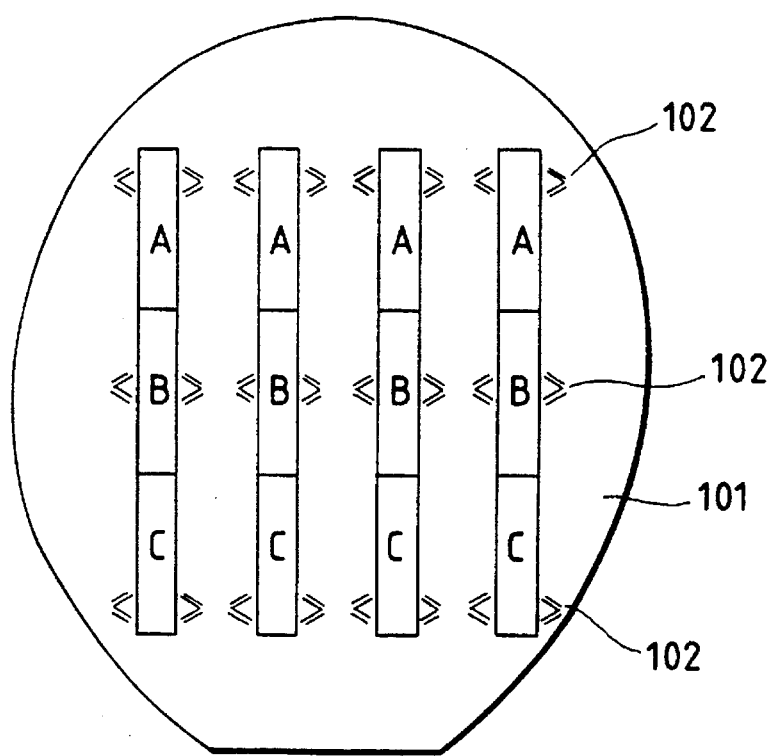
Figure 4:
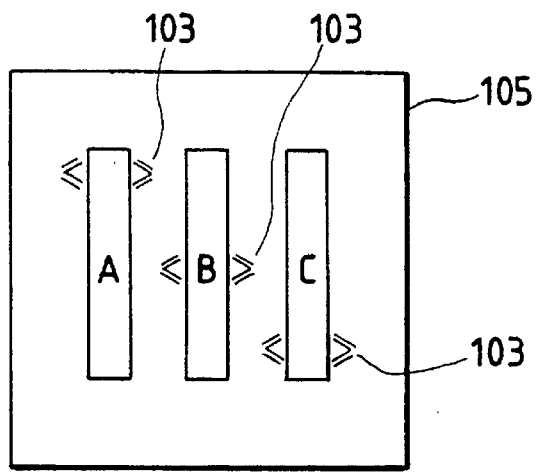
Figure 5:
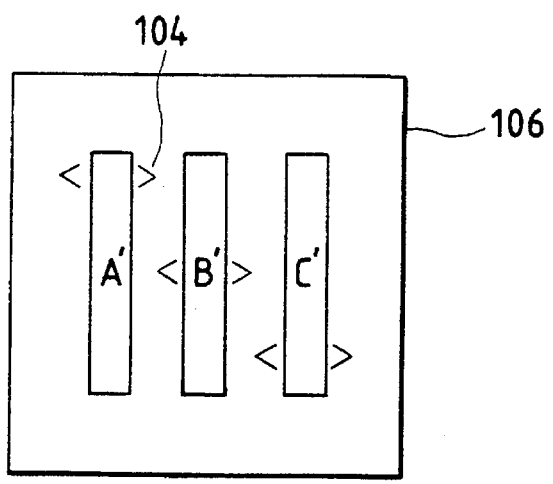

FIG. 3 shows a schematic pattern of a first layer on a semiconductor substrate, showing a first embodiment of a method of manufacturing semiconductor devices according to the present invention, FIG. 4 shows a schematic pattern of a first reticle 105 used in a 5:1 reduction projection exposure device for forming the first layer, and FIG. 5 is a schematic pattern of a second reticle 106 used to form a second layer of the first embodiment.

The first reticle 105 contains three divided patterns A, B and C. Each of these patterns represents an IC pattern. In this embodiment, the patterns A, B and C are joined to each other in the vertical direction to form a single chip.

The first reticle 105 shown in FIG. 4 is set in the generally used 5:1 demagnification projection exposure device, and then the layout of the first layer on a semiconductor substrate 101 (hereinafter referred to as a wafer 101) is programmed by the system attached to the device such that the pattern shown in FIG. 3 can be projected onto the wafer 101. The joining accuracy between the actually exposed patterns A, B and C is 0.1 µm or less in both vertical and horizontal directions. This joining accuracy can be achieved by positioning the patterns utilizing the laser interferometer of the reduction projection exposure device. During the exposure, it is desired that the patterns A and B or the patterns B and C be laid on top of the other at each joined portion over 0.1 to 0.5 µm. This is readily achieved by changing the step size of the reduction projection exposure device.

Alignment marks 103 shown in FIG. 4 are alignment marks used for the die by die method. After the exposure, the alignment marks 103 are present on the two sides of each of the joined patterns A, B and C on the semiconductor substrate, as shown in FIG. 3, and serve as alignment marks (parent marks) 102 for the second layer. When the first layer is projected using the first reticle 105, the position of a masking blade of the reduction projection exposure device is changed for each shot (pattern A, B or C) to cover the patterns other than the projected pattern. For example, when the pattern A is projected, the other patterns B and C are covered by the blade so that no light reaches them. Patterns B and C are projected in the same manner.

After the patterns A, B and C are formed, normal semiconductor manufacturing processes are conducted using the formed pattern, such as etching, diffusion of impurities or deposition of a chemical vapor deposition film, and then the second layer is patterned.

The second layer is formed using the second reticle 106 shown in FIG. 5 by aligning the alignment marks 102 formed in the first layer as the parent marks to alignment marks 104 which serve as the child marks. That is, pattern A' is aligned to the pattern A, pattern B' is aligned to the pattern B. When the patterns A', B' and C' are projected, the position of the masking blade is changed for each shot as in case of the first layer.

The above-described patterning operation is repeated a required number of times with introduction of impurities and metal interconnection being conducted after patterning of each layer to form ICs having a chip size of 3.5 mm×60 mm on a design rule of 0.8 µm.

[Second Embodiment]

Figure 6:
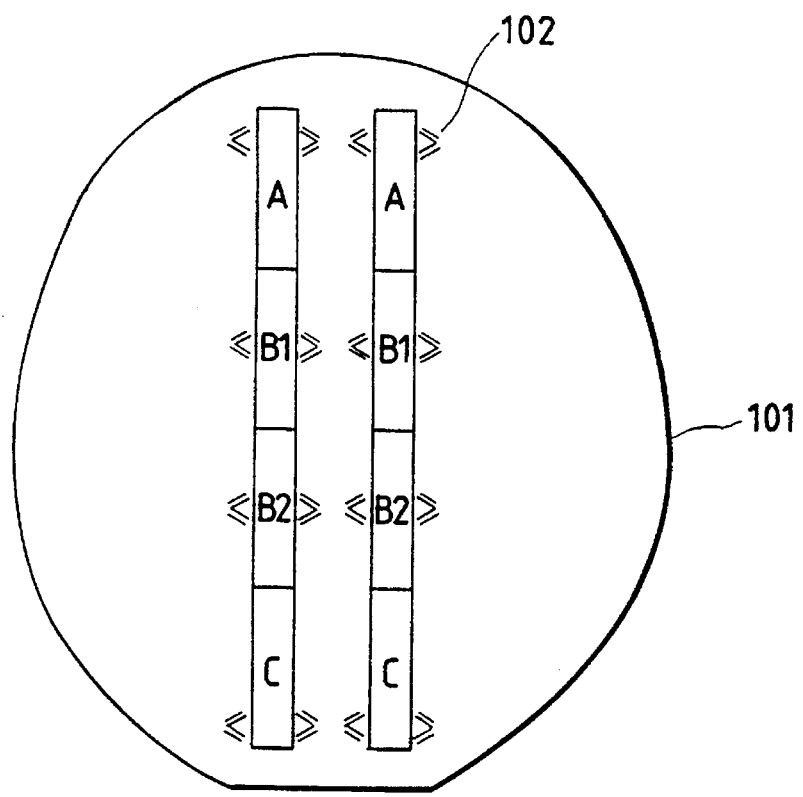

FIG. 6 schematically shows the pattern of a first layer on the semiconductor substrate 101 which is used in a second embodiment of the present invention.

In this embodiment, the pattern B located in the middle of the IC pattern formed in the first embodiment by connecting three types of patterns A, B and C is projected repeatedly as patterns B1 and B2 so as to make the length of the chip size longer than that of the chip size in the first embodiment. A desired number of intermediate patterns B1 and B2 can be joined. This enables manufacture of semiconductor devices having various lengths.

In this embodiment, three types of patterns A, B and C are joined to form a single chip. Two or four types of them may also be used.

Furthermore, the number of reticles used in a single process is not limited to one but two or more types of reticles may be used exchangeably.

[Third Embodiment]

Figure 7:
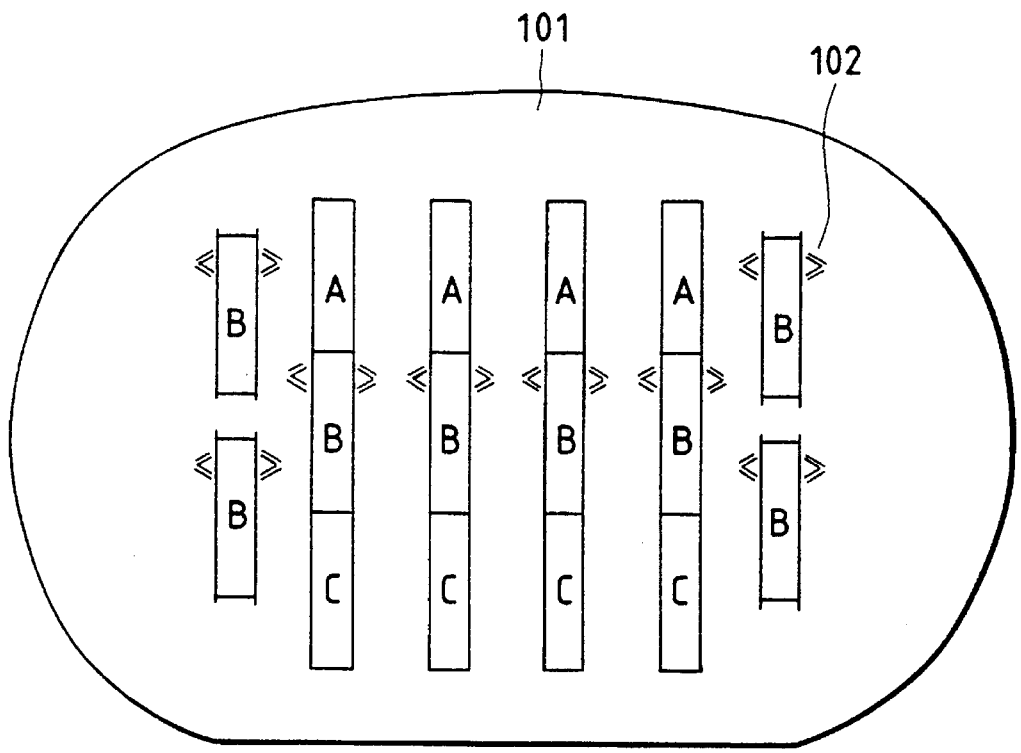
Figure 8:
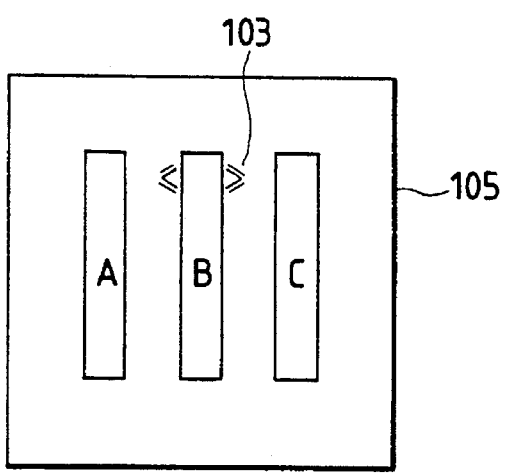
Figure 9:
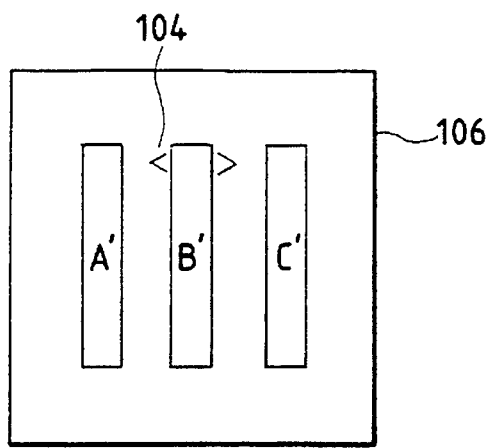

FIG. 7 schematically shows how a first layer is patterned on a semiconductor substrate in a third embodiment of the present invention, FIG. 8 shows a first reticle 105 used in a 5:1 reduction projection exposure device to form the first layer, and FIG. 9 shows a second reticle 106 used to form a second layer of the third embodiment.

As in the case of the first embodiment, the first reticle 105 shown in FIG. 8 is set in the exposure device, and then the layout of the first layer on the wafer 101 is programmed in the exposure device using the system attached thereto such that the pattern shown in FIG. 7 can be projected onto the wafer 101 which serves as the semiconductor device. In this embodiment, the joining accuracy between the patterns A and B or the patterns B and C is 0.1 µm or less in both vertical and horizontal directions, as in the previous embodiments. Alignment marks 103 shown in FIG. 8 are alignment marks used for the die by die method. The alignment marks 103 are present on the two sides of each of the patterns B in the patterns A, B and C, as shown in FIG. 7, and serve as the alignment marks (parent marks) 102 for the second layer.

When the first layer is projected using the first reticle 105, the position of the masking blade of the reduction projection exposure device is changed for each shot. In this embodiment, four of the patterns B alone are formed separately from other patterns on the periphery of the semiconductor substrate. Also, in the first and second reticles 105 and 106 shown in FIGS. 8 and 9, the position of the patterns A and C relative to the pattern B is known.

Next, the second layer is formed using the second reticle 106 shown in FIG. 9 by aligning the alignment marks 102 formed in the first layer as the parent marks to the alignment marks 104 serving as the child marks. This alignment conducted in the third embodiment differs in the manner described below from that performed in the aforementioned first and second embodiments.

(1) When the alignment marks 102 are aligned to the alignment marks 104 to form the second layer, only eight patterns B shown in FIG. 7 are scanned using a laser to measure offsets between the eight patterns B which constitute eight chips.

(2) The thus-obtained measured values are operated to calculate how much the alighment marks 102 are offset from the alignment marks 104 in X, Y and θ directions in the patterns B.

(3) The offsets in the eight patterns B are averaged.

(4) The patterns A', B' and C' are moved by the obtained averaged offset and then projected. Stage accuracy alone of the XY stage of the reduction projection exposure device is utilized to achieve projection.

Thus, the pattern A' is projected over the pattern A, and the pattern B' is projected on top of the pattern B. When the patterns A', B' and C' are exposed, the position of the masking blade is changed in the manner described in the first layer.

With the aforementioned alignment technique, the joining accuracy between the patterns A' and B' or between the patterns B' and C' can be improved as compared with that achieved in the first and second embodiments. Whereas joining accuracy in the first and second embodiment is $3\sigma=0.23$ µm, joining accuracy of $3\sigma=0.20$ µm is achieved in the third embodiment.

[Fourth Embodiment]

Figure 10:
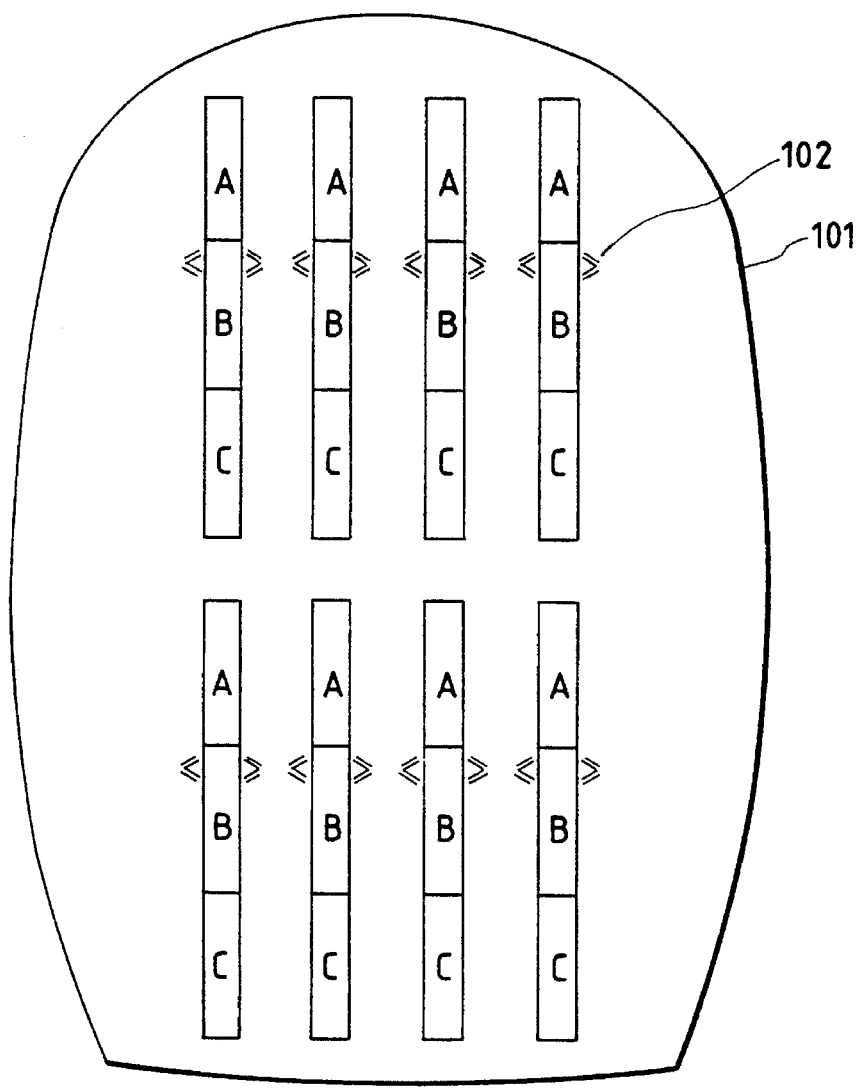

FIG. 10 shows the pattern of a first layer on a wafer used in the fourth embodiment of the present invention.

In this embodiment, the first reticle is set, and then the layout of the first layer on the wafer 101 is programmed so that the pattern shown in FIG. 10 can be formed, as in the case of the third embodiment. However, the fourth embodiment is different from the third embodiment in that alignment is performed using the normally formed pattern (in this embodiment, the pattern B is used) without using the dedicated patterns exclusively used for alignment formed on the periphery of the wafer. Like the third embodiment, this embodiment achieves joining accuracy of $3\sigma=0.20$ μm between the patterns A' and B' or between the patterns B' and C'.

In both third and fourth embodiments, three types of patterns A, B and C are joined to form a single chip. However, the number of patterns to be joined may be two, four or above.

Furthermore, the number of reticles used in a single process is not limited one but two or more types of reticles may also be used exchangeably.

The aforementioned overlapping will be described below in detail.

Although projection of the individual patterns can be made in this invention without providing the overlapped portion between the adjacent patterns, provision of the overlapped portion is desired to achieve an improved accuracy or yield.

Figure 11:
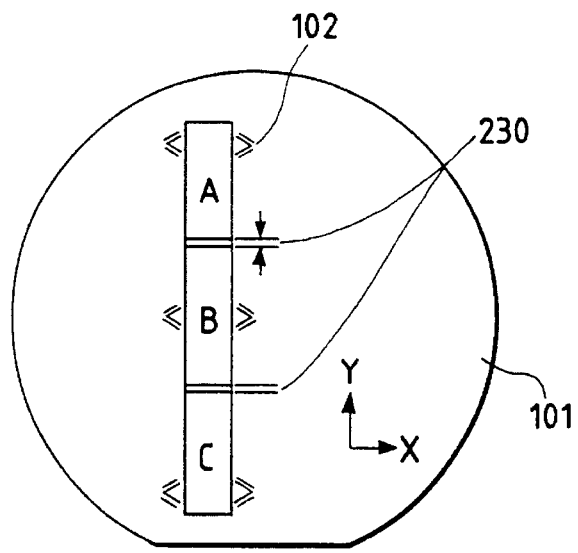
Figure 12A:
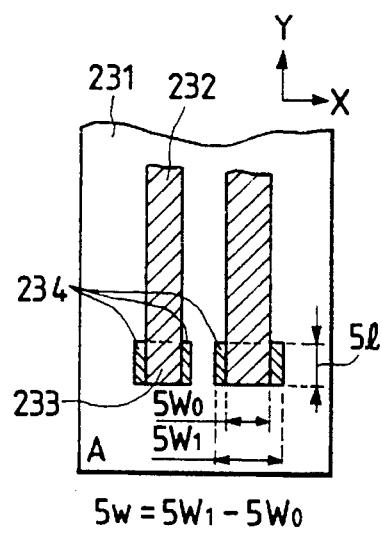
FIGS. 12A and 12B respectively show a reticle described in the embodiment of the present invention.
Figure 12B:
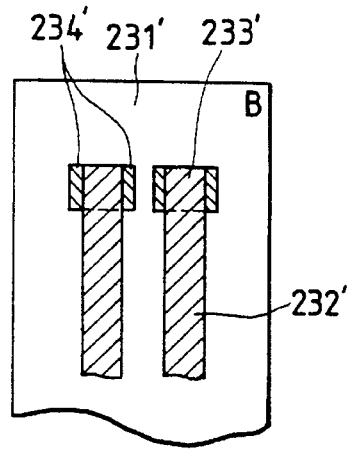
Figure 12C:
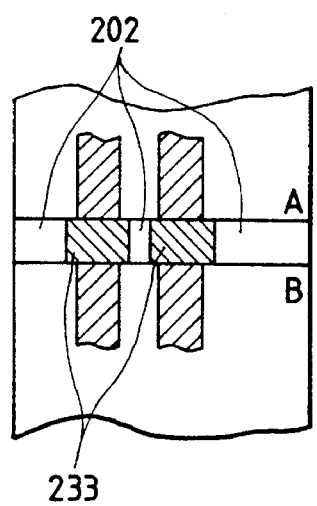
FIG. 12C show the pattern formed using the reticles shown in FIGS. 12A and 12B.

FIG. 11 illustrates how the individual patterns are overlapped. In FIG. 11, the patterns A, B and C are joined to each other on the substrate with an overlapped portion 230 formed between the adjacent patterns by overlapping part of one pattern on part of the other. FIGS. 12A and 12B respectively show the reticles used to form the connecting portion 230. A remaining pattern 233 located at one end of a pattern 232 made of chromium and formed on a glass plate 231 has wide portions 234. The remaining pattern 233 located at one end of the reticle A (FIG. 12A) is projected such that it overlaps a remaining pattern 233' located at one end of a reticle B (FIG. 12B), as shown in FIG. 12C.

In this example, since projection is conducted using the 5:1 reduction projection exposure device, the ratio between the pattern on the reticle to the pattern on the substrate is 5:1. Therefore, a length 5l and a width $5W_1$ of the remaining pattern 233 on the reticle are respectively reduced to a length l and a width $W_1$ on the substrate. A width 5w of the wide portions 234 is expressed by $5w=5W_1-5W_0$, as shown in FIG. 12A, where $w_0$ is the width of the formed chromium pattern.

Figure 13:
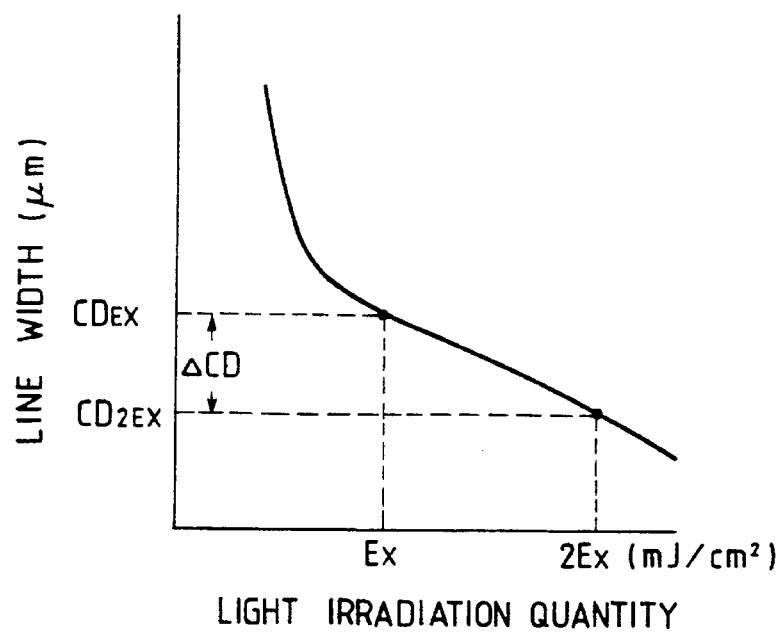
FIG. 13 is a graph showing the relationship between the amount of exposure and the line width.

FIG. 13 shows the relationship between the amount of exposure and the line width. As shown in FIG. 13, since the connecting portion 230 is double exposed, this double exposed area is thinner than the other portion by $\Delta CD$. To compensate for this, the remaining patterns 233 and 233' are formed wider beforehand. l and w of the remaining pattern 233 or 233' are calculated in the manner described below. That is, assuming that joining accuracy in the Y direction in the used exposure device is $\overline{X}+3\sigma$ and that the difference between the line width $CD_{EX}$ at the amount of exposure Ex and the line width $CD_{2EX}$ at the amount of exposure $2_{EX}$ is $\Delta CD = CD_{EX} - CD_{2EX}$ $l \geq \frac{1}{2}(|\overline{X}|+3\sigma)$ $w = \frac{1}{2}\Delta CD$ It was found from the measurements that joining accuracy was $\overline{X}=0.09$ μm $3\sigma=0.23$ μm and that, at the amount of exposure of 68 mJ/cm$^2$, $\Delta CD=0.20$ μm.

Therefore, $l=0.16$ μm and $w=0.10$ μm. Since the address size of the reticle is 0.25 μm, l is converted to the multiple of 0.05 μm as follows:

$l=0.20$ μm, and $w=0.10$ μm

Overlapping exposure was conducted using the reticles having the aforementioned dimensions to form IC chips having dimensions of 3.1 mm×54 mm on a design rule of 0.7 μm.

The reason why the connecting portion 230 is provided is that when offsets between the patterns occur, line disconnection or separation disability may occur in the patterns. Providion of the connecting portion 230 can overcome this problem.

In this example, $l=0.2$ μm and $w=0.1$ μm. However, l and w are not limited to these values but they may in general be set between 0.1 and 0.5 μm and between 0.05 and 0.2 μm, respectively. Furthermore, in this example, the circuit patterns are one-dimensionally joined. The patterns may also be joined two-dimensionally or in any other manner as long as it does not change the scope of the present invention.

[Fifth Embodiment]

Figure 14:
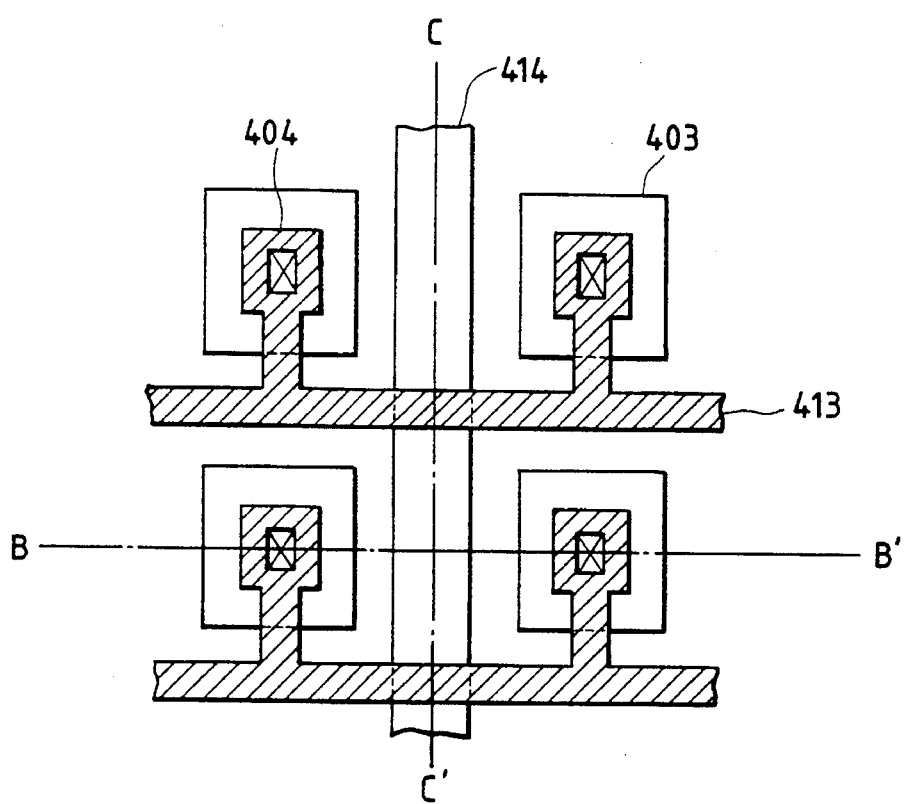
FIG. 14 is a plan view of one example of a photoelectric cell.
Figure 15:
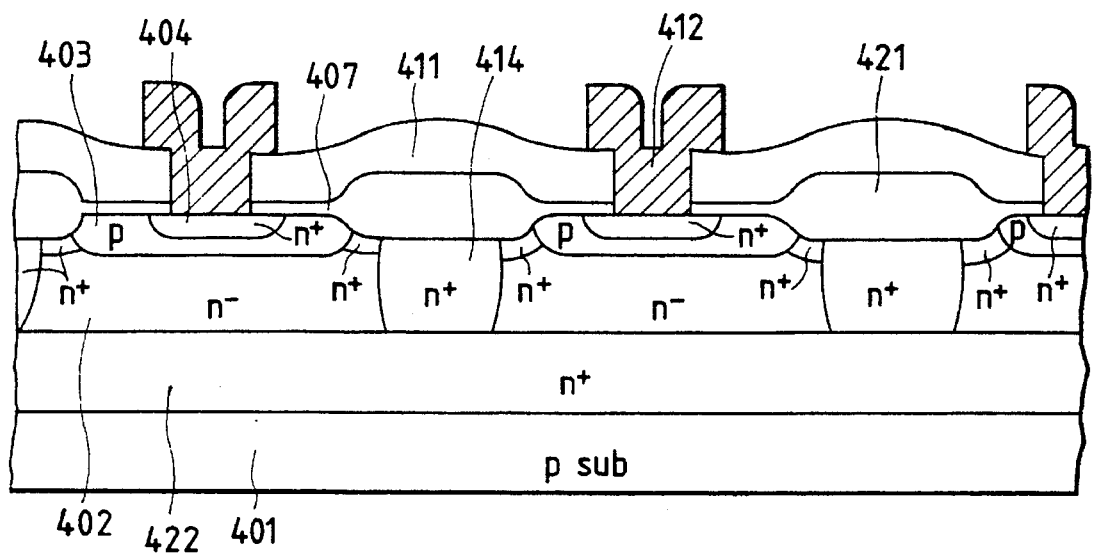
FIG. 15 is a section taken along a line B—B' of FIG. 14.

FIG. 14 is a plan view of one example of a photoelectric cell in a photoelectric conversion device, and FIG. 15 is a section taken along the line B—B' of FIG. 14.

When the scale of the photoelectric conversion device which uses the photoelectric cells shown in FIG. 14 is larger than the field size of the stepper, the photoelectric conversion device can be manufactured by utilizing the aforementioned exposure technique in which the divided portions thereof are joined in the manner described above.

FIG. 15 shows how the photoelectric cell is formed on a semiconductor substrate 401.

Each of the photoelectric cells has the following structure.

A n⁻region 402, which serves as a collector region, is formed on the substrate 401 by the epitaxial growth, and a p base region 403 and a n⁺ emitter region. 404 are formed on the collector region 402 to form a bipolar transistor.

The p base regions 403 are arranged two-dimensionally. The individual cells aligned in the horizontal direction are separated from the adjacent cells in the vertical direction by a device separation area.

Although not described, MOSFETs and capacitors are disposed on the same semiconductor substrate, as shown in FIG. 16.

Also, a gate electrode (not shown) is formed between the adjoining p base regions 403 with an oxide film 407 therebetween, by means of which a p channel MOS transistor Qc whose source and drain regions are respectively constituted by the adjoining p base regions 403 is formed.

This p channel MOS transistor Qc is of the normally off type which is off when the potential of the gate electrode 408 is grounded or positive. This electrically separates the p base regions 403 of the adjoining cells. Conversely, when the potential of the gate electrode 408 exceeds the threshold voltage Vth, the p channel MOS transistor Qc is turned on to make the p base regions 403 of the adjoining cells conductive.

The gate electrodes 408 are connected to a common drive line for each horizontal row. Capacitor electrodes 409 for controlling the potential of the p base regions 403 are also connected to the drive line. Each of the drive lines extends in the horizontal direction on an oxide film which serves as the device separating area.

After a transparent insulating layer 411 is formed, an emitter electrode 412 is formed. The emitter electrodes 412 are connected to a vertical line for each column. A collector electrode 414 is formed on the rear surface of the substrate 401 with an ohmic contact layer therebetween.

Figure 16A:
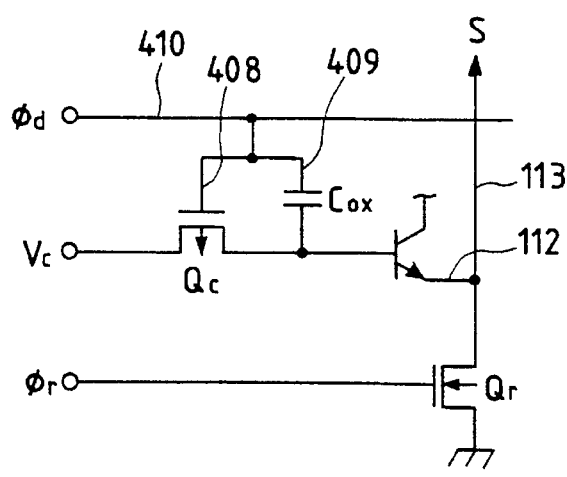
FIG. 16A is a circuit diagram of a photoelectric cell.
Figure 16B:
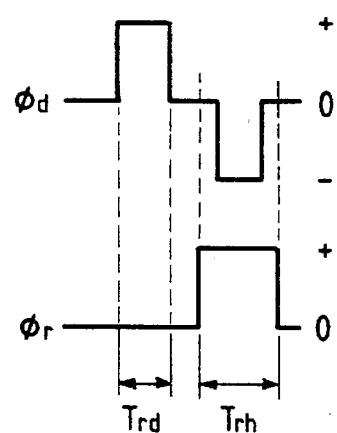
FIG. 16B is a timing chart of the photoelectric cell of FIG. 16A.

FIG. 16A shows an equivalent circuit of the photoelectric cell, and FIG. 16B shows the waveforms of the voltages to illustrate the operation of the photoelectric cell.

First, it is assumed that the p base region 403 has stored carriers (holes) corresponding to the intensity of incident light and that a negative voltage Vc and a positive voltage have respectively been applied to the terminal of the p channel MOS transistor Qc and the collector electrode 414.

In this state, if a positive voltage ϕd is applied to the drive line 410 (in a period of Trd), the potential of the p base region 403 is raised through the capacitor $C_{ox}$ and a signal corresponding to the stored carriers is read out to the emitter (reading-out operation).

Subsequently, a negative voltage ϕd is applied to the drive line 410 (in a period of Trh) to turn on the MOS transistor Qc. Consequently, the adjoining p base regions 403 are made conductive and the base potential is reset to a voltage Vc (refreshing operation).

A pulse ϕr having a logical high level is applied to turn on the transistor Qr and thereby reset the vertical line 413.

Once the above refreshing operation has been completed, storage operation begins, and then the similar operations are repeated.

In brief, in the method proposed in this example, the carriers generated by illumination are stored in the p base region 403, and the current which flows from the emitter electrode 408 to the collector electrode 414 is controlled by the charge stored in the p base region 403. Therefore, the stored carriers are amplified by the amplification function of each cell and are then read out. This achieves high output and sensitivity and low noise level.

The potential Vp generated in the base by the carriers (holes in this example) stored in the base by illumination is given by Q/C, where Q is the amount of holes stored in the base and C is the capacitance connected to the base.

It is clear from the above expression that an increase in the integration density reduces not only the cell size but also Q and C. Therefore, the potential Vp generated by illumination can be maintained substantially constant. This proposed method is therefore advantageous to cope with an increase in the-resolution which is anticipated in the future.

Figure 17:
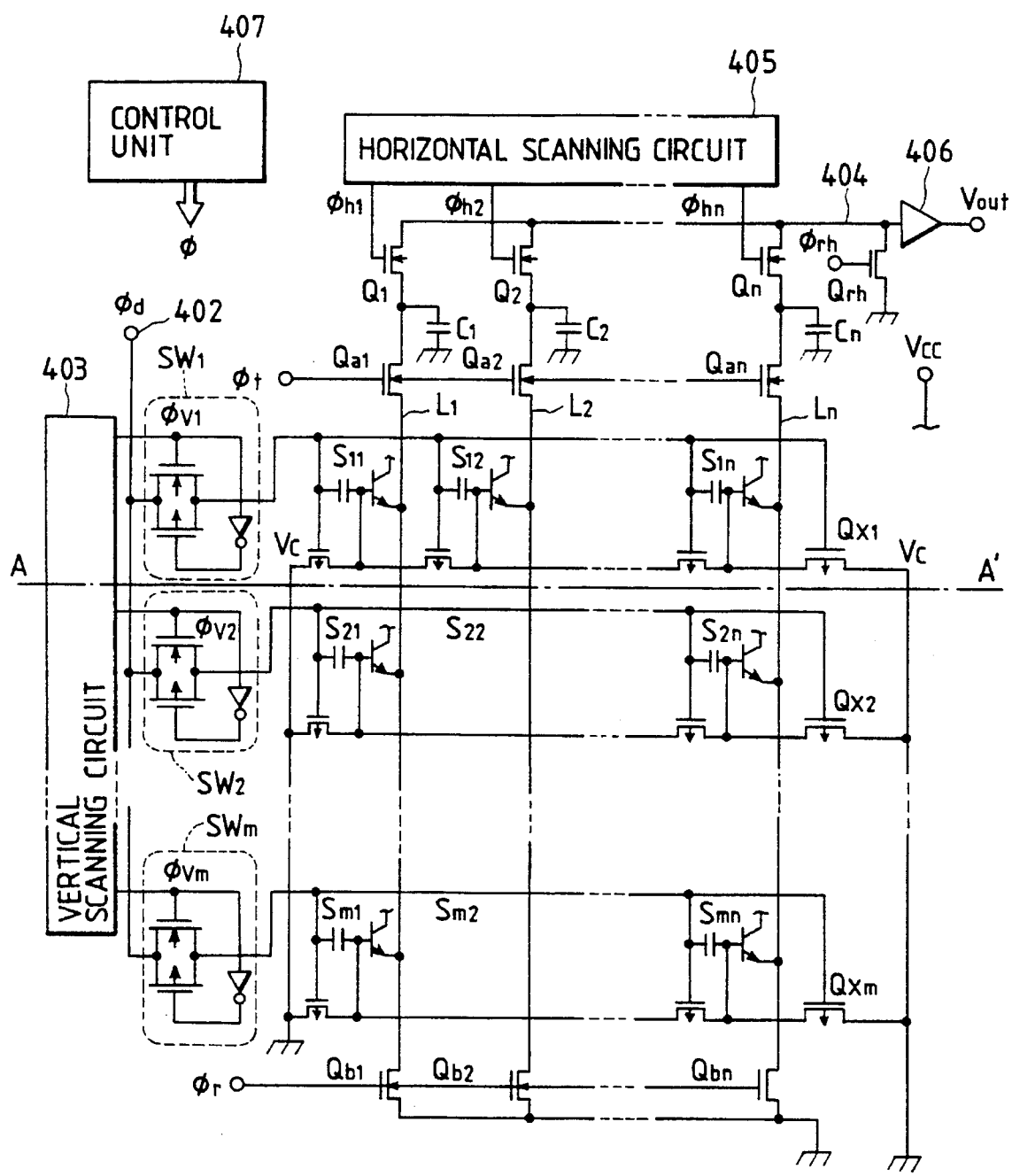
FIG. 17 is a circuit diagram of a photoelectric conversion device.

FIG. 17 is a circuit diagram of a photoelectric conversion device which uses the photoelectric cells shown in FIG. 14.

In this embodiment, the photoelectric cells are joined at a line A—A' to manufacture a photoelectric conversion device having a size larger than the field size of the reduction projection exposure device. When the joined portion is set in the active region of a transistor in the photoelectric conversion device, the output of the joined portion is varied greatly, increasing the level of fixed pattern noises (EPN) and greatly deteriorating the characteristics of the photoelectric conversion device.

In the case other than the photoelectric conversion device, the characteristics of the semiconductor device may also be deteriorated.

In this embodiment, since the joined portion is present in the device separating area of the photoelectric conversion device, the characteristics of the photoelectric conversion device are not affected by the offsets generated in the joined portion.

FIG. 18 illustrates the method of manufacturing a semiconductor device according to the present embodiment.

First, a N layer and a P layer are formed on a P type semiconductor substrate, and then a N layer is formed by the epitaxial growth to form a collector region of a bipolar transistor.

After a well region of a MOSFET is formed, a N region for separating the bipolar transistors of the photoelectric cells is formed by implanting $5 \times 10^{15}/cm^{-2}$ of P+ ions and then by conducting heat treatment at 1150° C. for 300 minutes.

In this embodiment, this n type region forms the joined portion. On the pattern, the joined portion is indicated by a C—C' line in FIG. 14.

Therefore, the base 403 and emitter 404 regions of the semiconductor device do not exist in the joined portion, and variations in the characteristics of the joined portion of the semiconductor device can thus be avoided.

When the base 403 and emitter 404 regions are present in the joined portion, the area of the base or emitter may greatly be changed relative to the other pixels due to an offset present in the joined portion. This varies the light response output of the joined portion relative to that the other portions and thus generates fixed pattern noises (EPN).

Subsequently, field oxidation is conducted by the LOCOS process to separate the MOSFETs. Next, the base region of the bipolar transistor is formed, and then a gate oxidized film and a gate electrode of the MOSFET are formed.

Thereafter, the source and drain of the MOSFET and the emitter region of the bipolar transistor are formed and then metal interconnection is conducted to form a photoelectric conversion device.

The thus-obtained photoelectric conversion device has a chip size of 3.1 mm×54 mm. The designing rule was 0.8 μm.

Variations (FPN) in the light response output of the joined portion were the same as those of the other portions.

In this embodiment, the joined portion exists in the collector region of the bipolar transistor. However, it may also be present in the P type region of the bipolar transistor, which is called an isolation region. Furthermore, this embodiment can also be applied to semiconductor devices other than the photoelectric conversion device.

[Sixth Embodiment]

Figure 19:
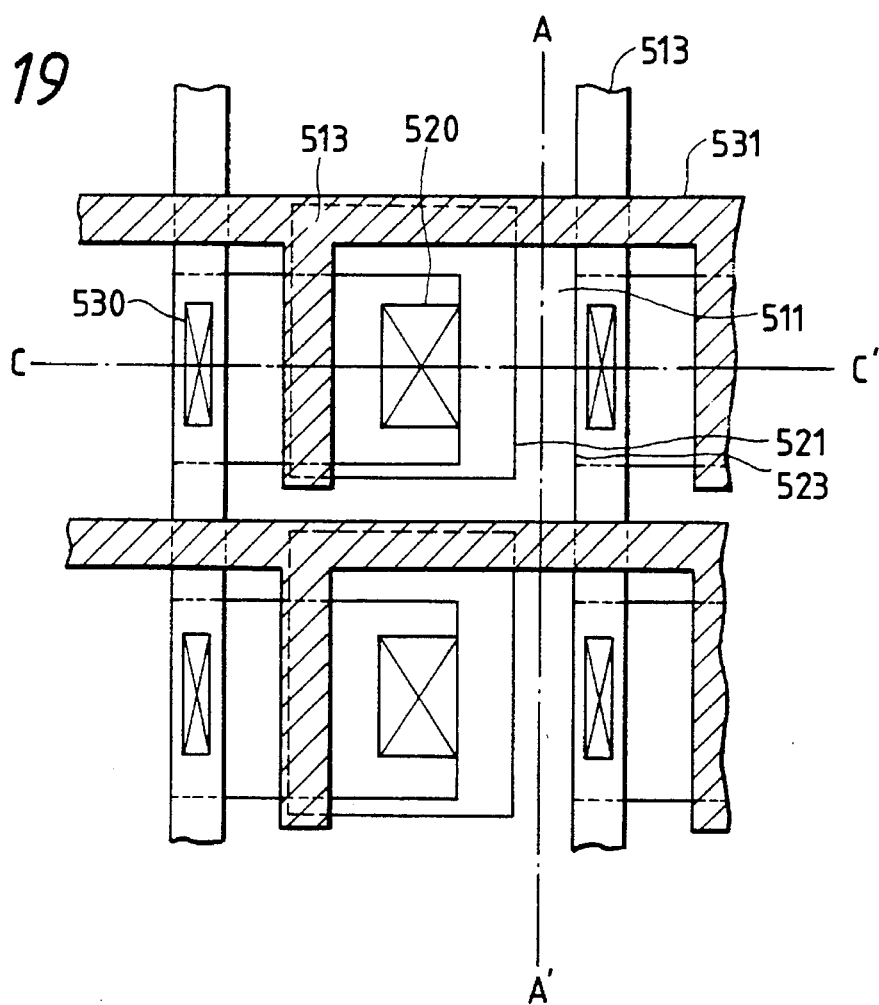
FIG. 19 is a plan view of a DRAM.

FIG. 19 shows a sixth embodiment of the present invention in which the present invention is applied to a dynamic random access memory (hereinafter referred to as a DRAM).

Figure 20A:
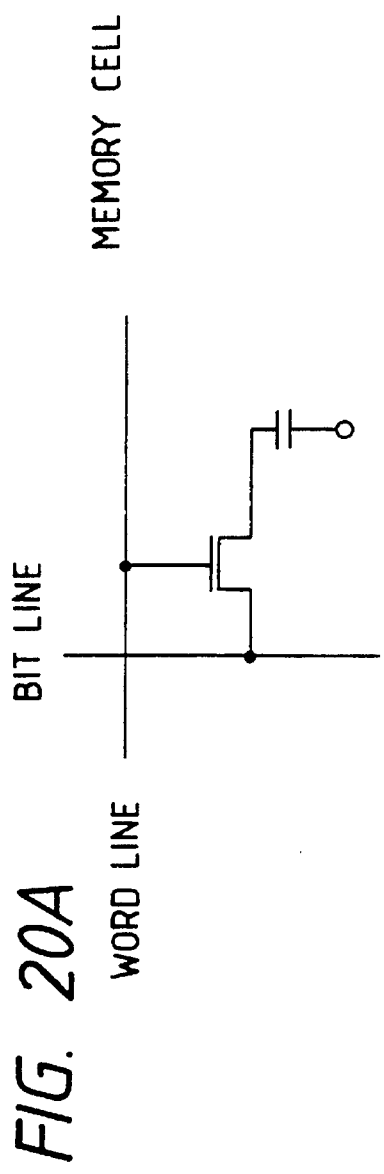
FIG. 20A is a circuit diagram of the DRAM of FIG. 19.
Figure 20B:
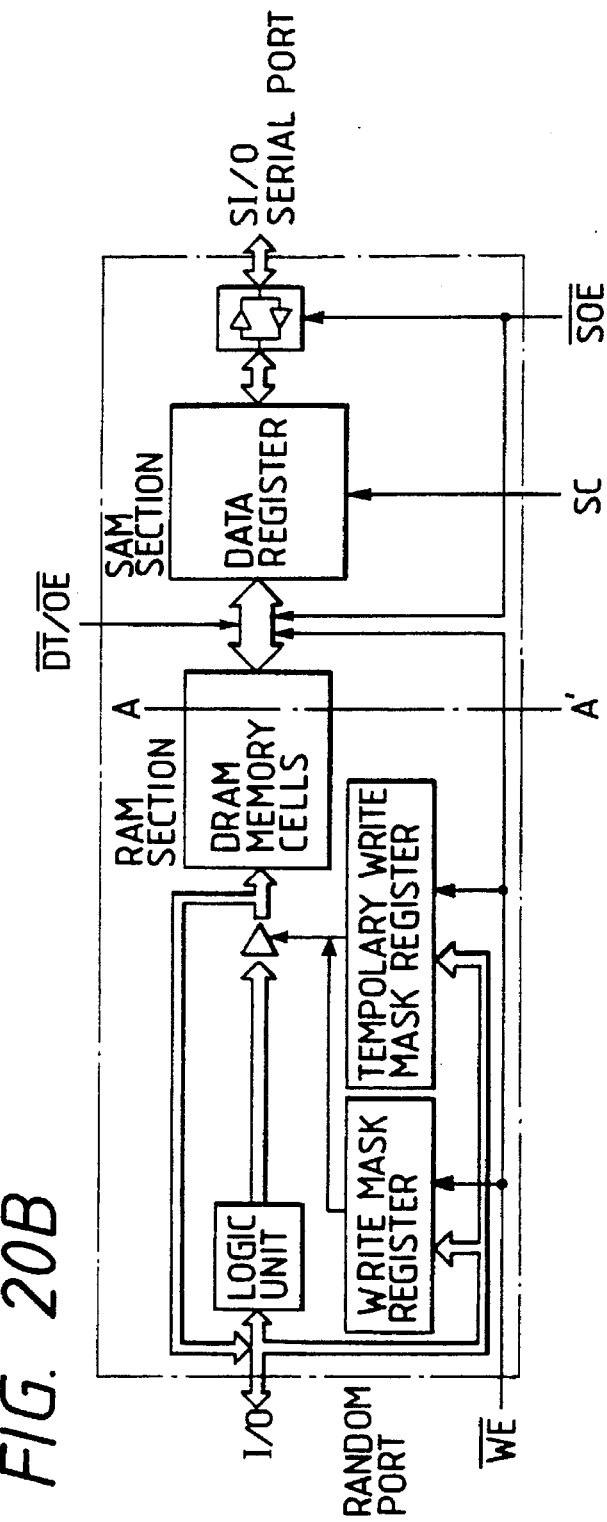
FIG. 20B is a block diagram of a semiconductor device having the DRAM of FIG. 20A.

DRAMs generally have the configuration shown in FIG. 20. When the integration density of a semiconductor device is increased, the area of the DRAM memory cells is increased. In this embodiment, manufacture of DRAMs having a large capacity is enabled by conducting the aforementioned exposure process in which the memory cells are joined with each other at a device separating area.

Figure 21:
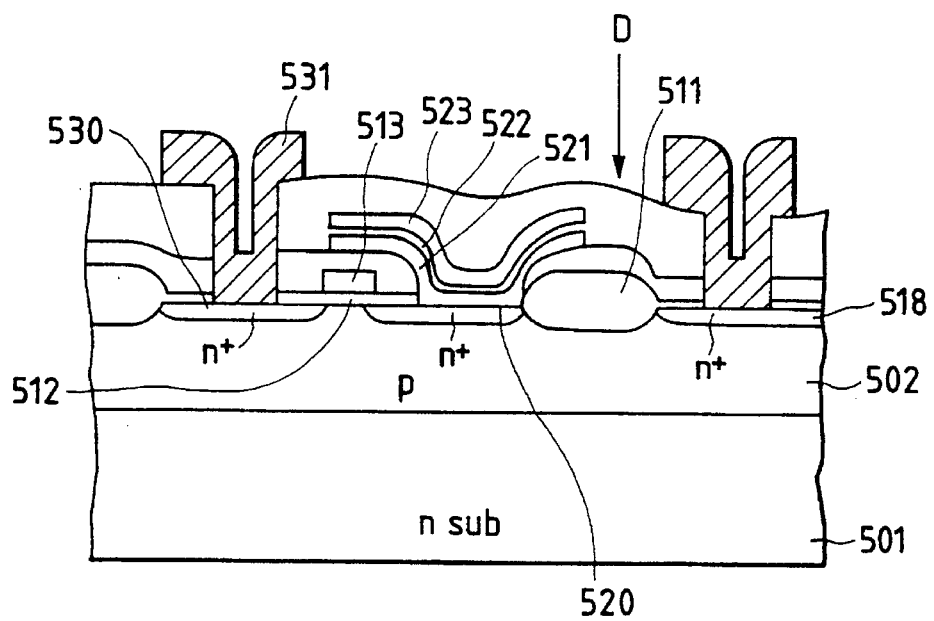
FIG. 21 is a section taken along a line C—C' of FIG. 19.

FIG. 19 is a plan view of a memory cell used in the sixth embodiment of the present invention. In FIG. 19, the joined portion is set in the portion indicated by a line A—A'. FIG. 21 is a section taken along a line C—C' of FIG. 19.

In FIG. 21, a portion indicated by a symbol D represents the device separating area of the memory cells.

The method of manufacturing semiconductor devices according to the sixth embodiment of the present invention will now be described with reference to FIG. 22.

First, a P type region 502 is formed on a N-type semiconductor substrate 501, a silicon oxide film is formed on the substrate 501 and then a $Si_3N_4$ film is formed by the LPCVD process.

The $Si_3N_4$ film is selectively removed by the resist patterning to form a device separating area at which the patterns are joined with each other in this embodiment. This device separating area is indicated by the line A—A' in FIG. 19. After the patterning, a silicon oxide film 511 having a thickness of 500 nm is formed by the heat treatment which is conducted at 1000° C. for 150 minutes.

Next, the $Si_3N_4$ film is removed, and a gate oxidation 512 is performed. A polysilicon is deposited to form a gate electrode 513. After source and drain regions 518 of the MOS transistor are formed, a polysilicon lower electrode 521 of a capacitor is formed, a dielectric portion 522 made of a silicon oxide film is formed, and then a polysilicon upper electrode 523 of the capacity device is formed.

Next, Al interconnection 531 is conducted to form bit lines, by which a DRAM is manufactured.

The thus-manufactured semiconductor device has a chip size of 32 mm×18 mm. The designing rule is 0.8 μm.

The capacitors located at the joined portion were not faulty.

[Seventh Embodiment]

Figure 23:
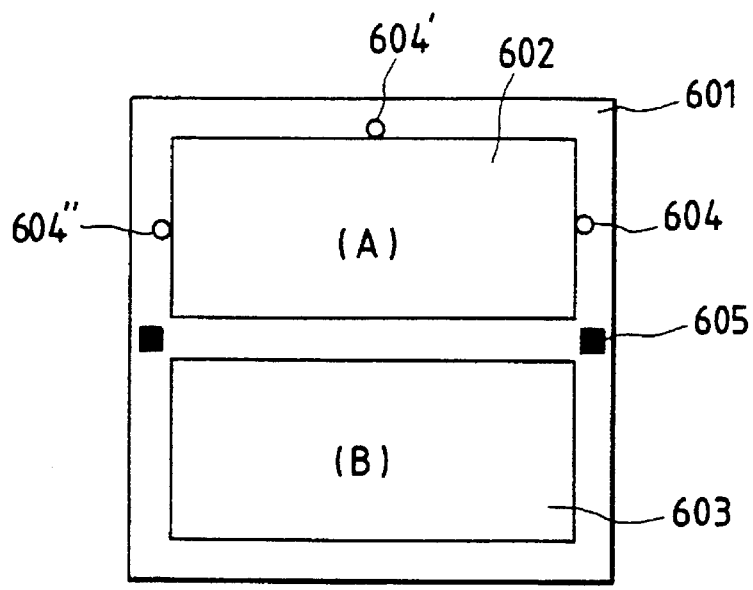
Figure 24:
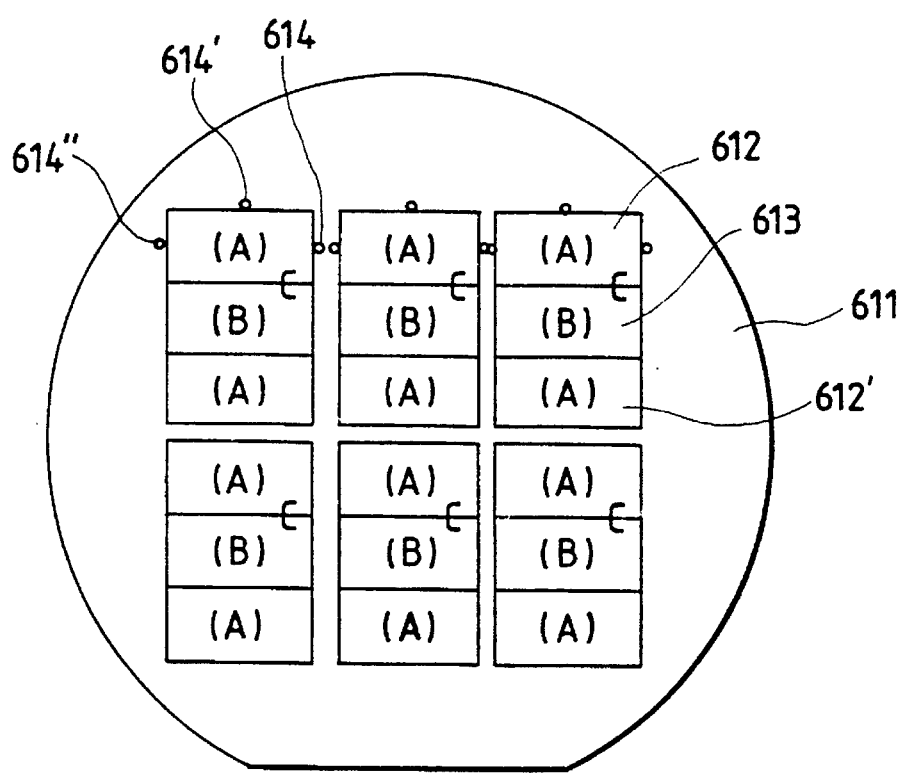

Seventh embodiment of the present invention will be described with reference to FIGS. 23 and 24. FIG. 23 schematically shows a reticle used to form a first layer, and FIG. 24 shows the pattern of the first layer. The reticle shown in FIG. 23 contains patterns A and B which respectively have memory and A/D converter functions. In this embodiment, the patterns A and B are joined in the longitudinal direction to form a pattern consisting of the patterns A, B and A. The joined patterns A, B and A form a single chip having the memory +A/D converter function. The manufacturing method of such semiconductor chips will now be described.

The reticle shown in FIG. 23 is set in the normally used reduction projection exposure device having a demagnification of 5:1, and then the layout of the first layer on a semiconductor substrate 611 (hereinafter referred to as a wafer 601) is programmed using the system attached to the exposure device so that the pattern shown in FIG. 24 and consisting of the patterns A, B and A can be projected on the wafer 601. Joining accuracy between the patterns A and B is restricted to 0.1 μm. This joining accuracy is achieved by a laser interferometer of the reduction projection exposure device. In this embodiment, the patterns A and B have the separate functions and are therefore not overlapped on top of the other except for the metal interconnection through which signals are exchanged between the patterns A and B. Alignment marks 604, 604' and 604" are respectively formed on the upper, left and right portions of the pattern A, as shown in FIG. 23. In the pattern of the first layer consisting of the patterns A, B and A, the alignment marks 604, 604' and 604" are formed on the outside of the upper pattern A. When the first layer is projected using the reticle shown in FIG. 23, the position of the masking blade of the reduction projection exposure device is changed for each shot (the pattern A or B) so as to cover the portion of the wafer corresponding to the other patterns. For example, when the portion of the wafer corresponding to the pattern A is projected, the portion thereof corresponding to the pattern B is covered by the masking blade so that no light reaches it. The pattern B is projected in the same manner.

Figure 25:
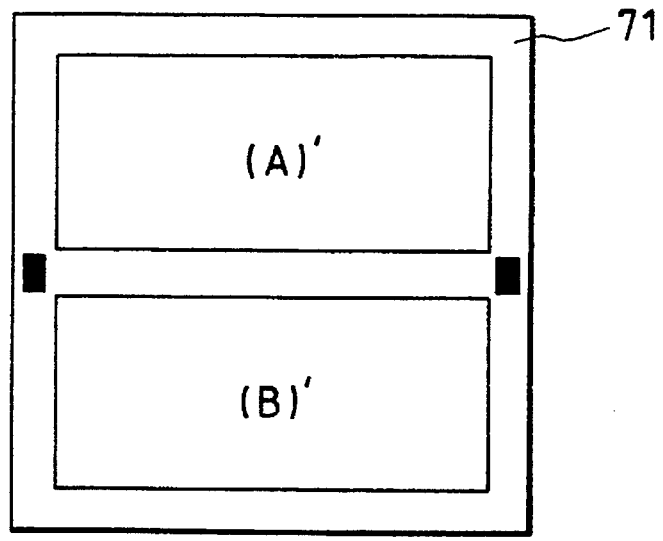
Figure 26:
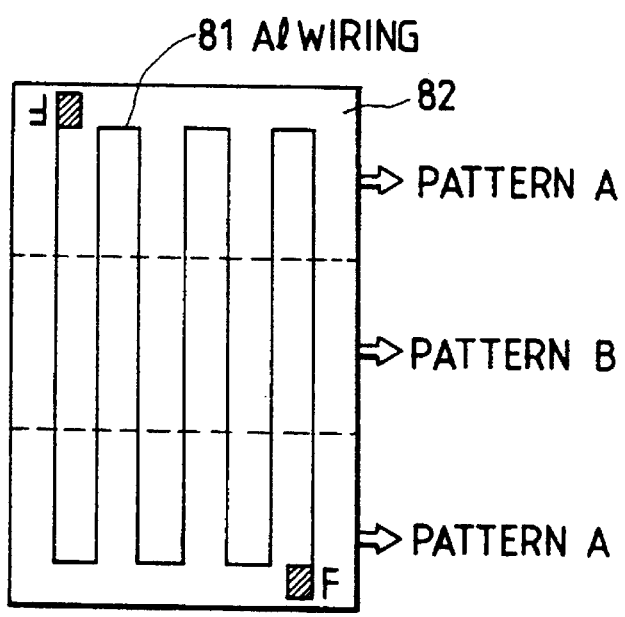
FIG. 26 illustrates a metal interconnection.

After the pattern consisting of the patterns A, B and C is formed, normally required semiconductor device manufacturing processes, including etching, diffusion of impurities and chemical vapor deposition, are conducted. Thereafter, the pattern of the second layer is formed using the reticle shown in FIG. 25. When the second layer is formed, the reticle is aligned to the wafer from the relative positional relationship between the alignment marks 614, 614' and 614" formed in the first layer and the alignment marks shown in FIG. 25 so that patterns A' and B' shown in FIG. 25 can respectively be projected over the patterns A and B shown in FIG. 23. It is, however, to be noted that the patterns A and B basically have separate functions and hence they are not overlapped on top of the other except for the metal interconnection. An improved C-MOS process is used to process the pattern A having the memory function and the pattern B having the function of A/D converter. The lowermost pattern A in a single chip consisting of the patterns A, B and A is formed by rotating the uppermost pattern A by 180 degrees and by projecting the rotated pattern A. Therefore, in the pattern consisting of the patterns A, B and A, the uppermost and lowermost patterns A are symmetrical with respect to the pattern B. FIG. 26 shows how the patterns A, B and A are interconnected by Al electrodes. As shown in FIG. 26, the patterns A and B are overlapped such that the patterns A are respectively disposed above and below the pattern B in the case of Al interconnection. The overlapping portion between the patterns A and B has a length of 0 to 0.5 μm. The pattern A to be formed below the pattern B is projected using the reduction projection exposure device having a function capable of rotating the reticle by 180 degrees. If the used exposure device does not have such a function, the reticle is manually rotated by 180 degrees. Formation of the second layer is also conducted by changing the position of the masking blade, as in the case of the first layer.

After each layer is patterned, the semiconductor device manufacturing processes, including introduction of impurities and metal interconnection, are conducted to form an IC having two different functions.

The manufactured IC chip has dimensions of 20 mm (in the X direction)×30 mm (in the Y direction) and two separate functions including the memory and A/D converter functions. The design rule is 0.8 μm.

[Eighth Embodiment]

Figure 27:
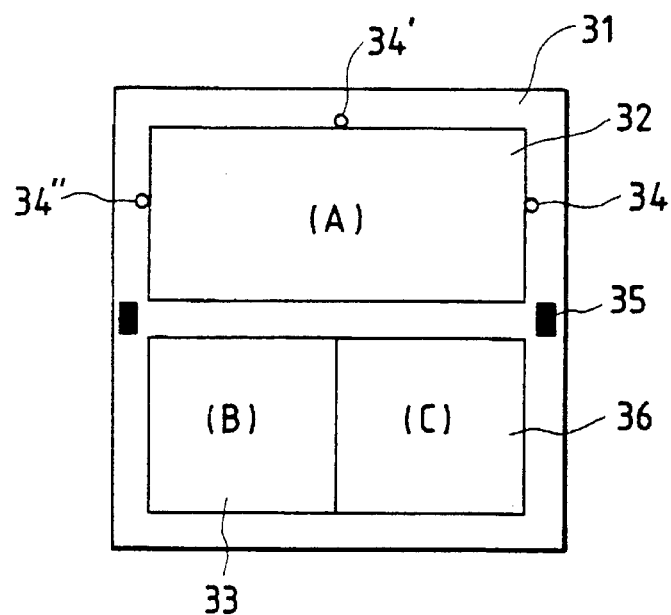
Figure 28:
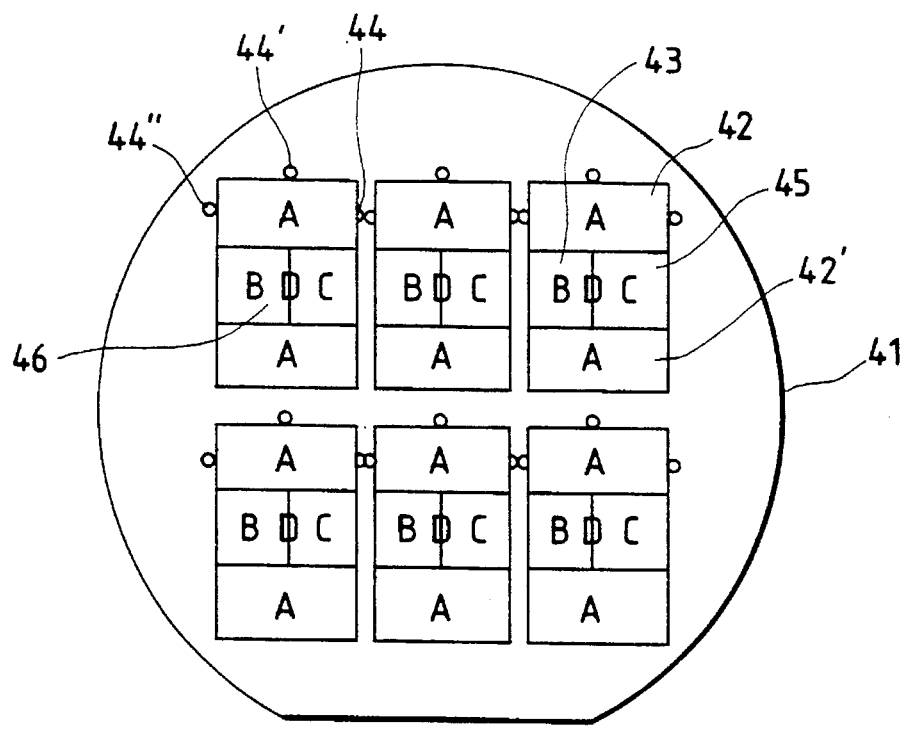

An eighth embodiment of the present invention will be described with reference to FIGS. 27 and 28. FIG. 27 shows a reticle used to form a first layer in the semiconductor device manufacturing method according to the eighth embodiment, and FIG. 28 shows the pattern of the first layer in the eighth embodiment. The eighth embodiment differs from the seventh embodiment in that the reticle shown in FIG. 27 contains three different patterns A, B and C. The pattern A has the memory function, the pattern B has the microcomputer function, and the pattern C has the A/D converter function. In this embodiment, the reticle shown in FIG. 27 is used, and the patterns A, B and C are joined in the manner shown in FIG. 28, i.e., the patterns A and B and patterns C and A are joined with each other, to form a single chip having memory+A/D converter+microcomputer functions. This enables manufacture of IC chips each having three different functions, such as memory+A/D converter+ microcomputer functions, and a chip size of 20 mm (in the X direction)×30 mm (in the Y direction). The design rule is 0.8 μm, as in the case of the seventh embodiment.

[Ninth Embodiment]

A ninth embodiment of the present invention will be described with reference to FIGS. 29A, 29B and 30. FIGS. 29A and 29B schematically show reticles used to form the first layer in the ninth embodiment of the present invention, and FIG. 30 schematically shows the first layer of the ninth embodiment. This embodiment differs from the seventh and eighth embodiments in that two reticles are used to pattern a single layer, as shown in FIGS. 29A and 29B. In this embodiment, the pattern A 652 of a reticle 651 shown in FIG. 29A has the memory function and the pattern B 653 of a reticle 651 shown in FIG. 29B has the A/D converter function. The pattern of the first layer shown in FIG. 30 is formed using a reticle exchange device provided in a reduction projection exposure device in the manner described below: the pattern A is first projected using the reticle 610 shown in FIG. 29A, and then the reticle 651 shown in FIG. 29B is automatically set on a reticle stage by the reticle exchange device and then aligned and projected.

In FIGS. 29A and 29B, alignment marks 654 are marks to be formed on the wafer, and alignment marks 655 are used to align the reticle to the exposure device body. In FIG. 30, patterns A 662 and B 663 are formed on a wafer 661. Alignment marks 665, 664' and 664" correspond to the alignment marks 654 shown in FIG. 29A. The patterns A and B have a connecting portion 666.

The first layer having the layout shown in FIG. 30 is formed on the wafer without conducting the alignment operation on the patterns A and B. Alignment of the first layer is achieved by a laser interferometer provided in a stepper body. The second and subsequent layers are aligned using the alignment marks 664, 664' and 664" formed on the pattern A. That is, after the pattern A' is projected over the pattern A, the exposure device is moved in the Y direction to project the pattern B' over the pattern B.

[Tenth Embodiment]

A tenth embodiment of the present invention, in which semiconductor devices are manufactured using both reduction and reflection projection exposure devices, will be described below.

In the IC process, some fabrication steps require an exposure device capable of exposure at high resolution and alignment accuracy while the other fabrication steps can employ an exposure device which achieves exposure at lower resolution and alignment accuracy.

A high resolution or alignment accuracy may not be required in some fabrication steps. Also, patterning may be conducted on a narrow area and joined patterning conducted in the aforementioned embodiments may not be required.

Therefore, in this embodiment, to achieve an increase in the throughput of the IC process and reduction in the production costs thereof, joined patterning is conducted when semiconductor devices having a large chip size must be formed at high resolution and alignment accuracy, and the reflection projection exposure device is used for other cases.

In the method of manufacturing semiconductor devices according to the tenth embodiment of the present invention, the throughput of the reduction projection exposure device is 22 patterns per hour when the number of types of the patterns to be joined is three, while that of the reflection projection exposure device is 80 patterns per hour.

Consequently, in the method of manufacturing semiconductor devices including the aforementioned joined exposure, the throughput of the patterning can be greatly improved.

The manufacturing method of this embodiment will be described below in detail.

Figure 31:
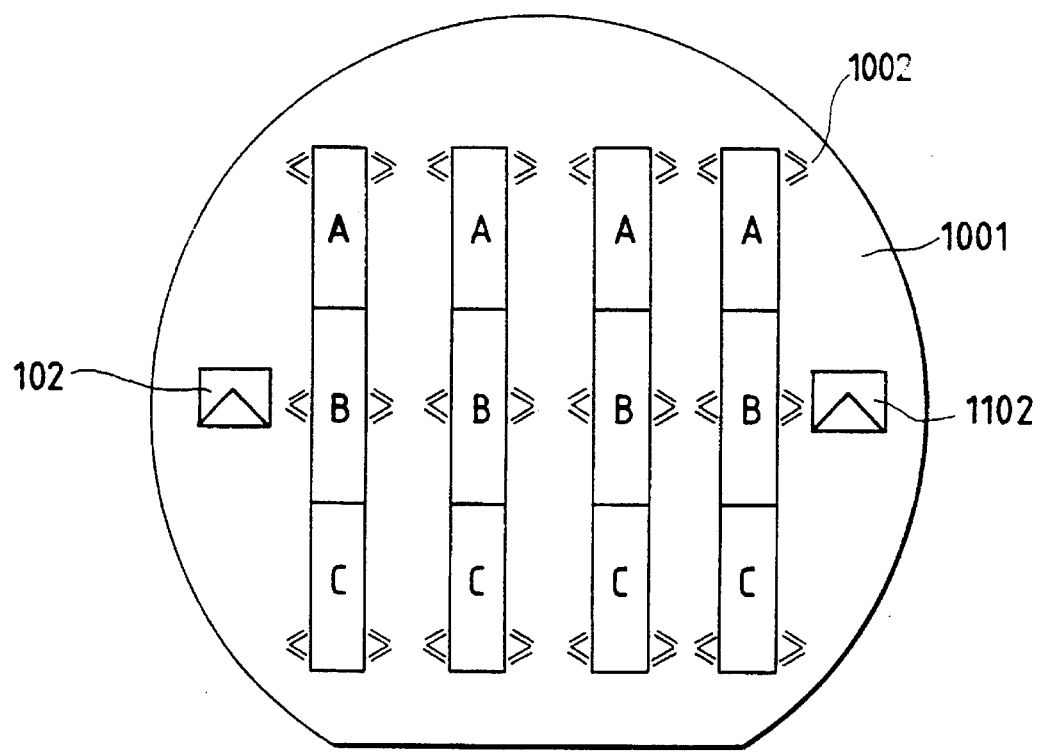
Figure 32:
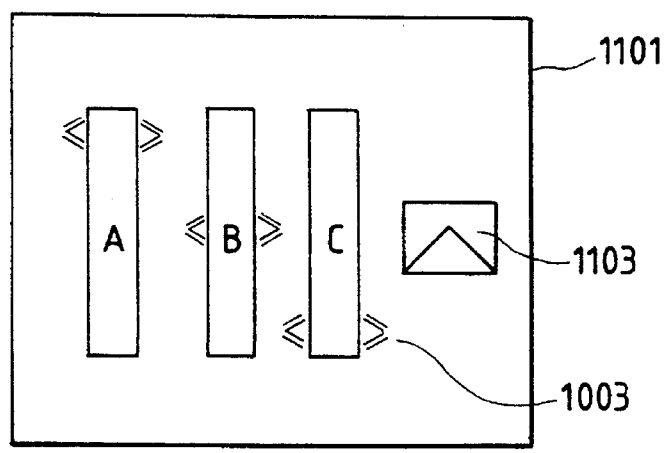

First, a first reticle 1101 shown in FIG. 32 is set in the normally used reduction projection exposure device which achieves demagnification ratio of 5:1 to project the joined patterns shown in FIG. 31 onto a wafer 1001.

Marks 1003 shown in FIG. 32 are alignment marks for the reduction projection exposure device. As shown in FIG. 31, the alignment marks 1003 are present on two sides of the individual patterns A, B and C on the wafer and serve as alignment marks (parent marks) 1002 for the exposure operation by the reduction projection exposure device.

A mark 1103 shown in FIG. 32 is an alignment mark for the reflection projection exposure device. As shown in FIG. 31, the alignment marks 1103 are formed on the right and left of the wafer to serve as alignment marks (parent marks) 1102 for the exposure operation by the reflection projection exposure device.

When the first layer is projected using the first reticle 1101, the position of the masking blade of the reduction projection exposure device is changed for each shot (for pattern A, B or C) to cover the portion of the wafer corresponding to the other patterns. For example, when the pattern A is projected, the portion of the wafer corresponding to the patterns B and C and the alignment marks used for the reflection projection exposure device is covered by the masking blade.

When the alignment mark 1103 used for the reflection projection exposure device is to be projected, the blade is removed from the mark 1103 shown in FIG. 32 and then the mark 1103 is projected to form the alignment marks used for the second and subsequent layers.

The alignment marks used for the reflection projection exposure device are generally larger than those used for the reduction projection exposure device. Therefore, the marks for the reflection projection exposure device may be formed using another reticle which is different from the reticle used to form the first layer. If the shape of the mark is devised, that mark may be used for both types of exposure devices.

Figure 33:
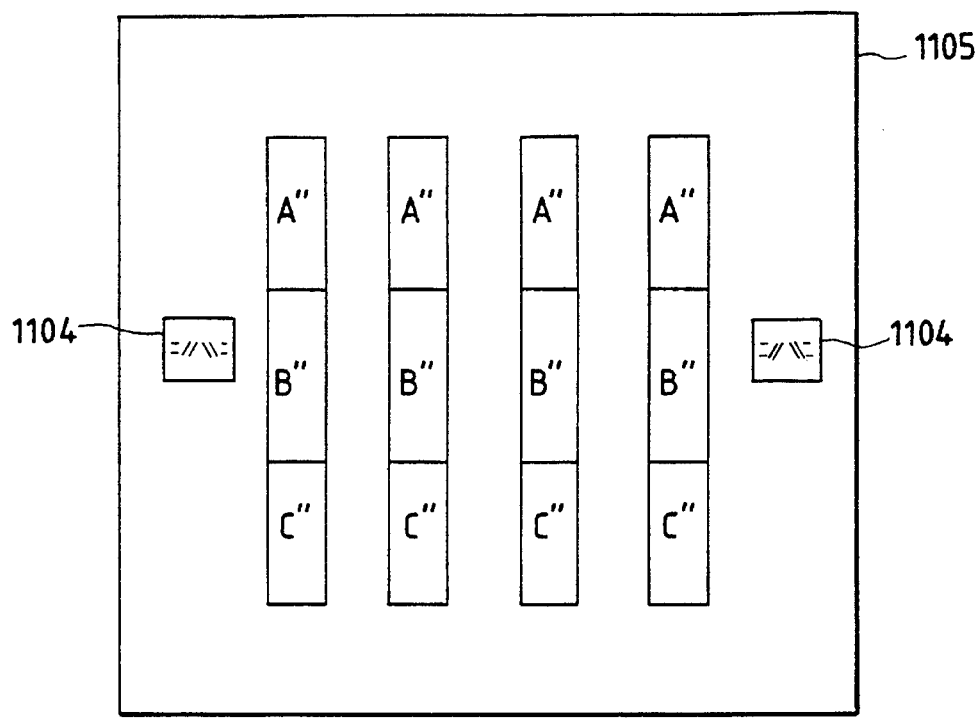

Next, the second layer is formed using a mask 1105 for the reflection projection exposure device shown in FIG. 33 by aligning the alignment marks 1102 which are the parent marks formed on the first layer to child marks 1104.

The formation of this second layer differs from that conducted in the first and second embodiments in that the patterns are projected by the reflection projection exposure device while alignment is conducted using the alignment marks formed on the right and left portions of the wafer.

Next, patterning is conducted using the reduction projection exposure device, as in the case of the first embodiment.

Semiconductor devices are formed by repeating the patterning process in the manner described above.

Consequently, manufacture of IC chips having dimensions of 3.5 mm×60 mm is enabled on a design rule of 0.8 μm.

Figure 34:
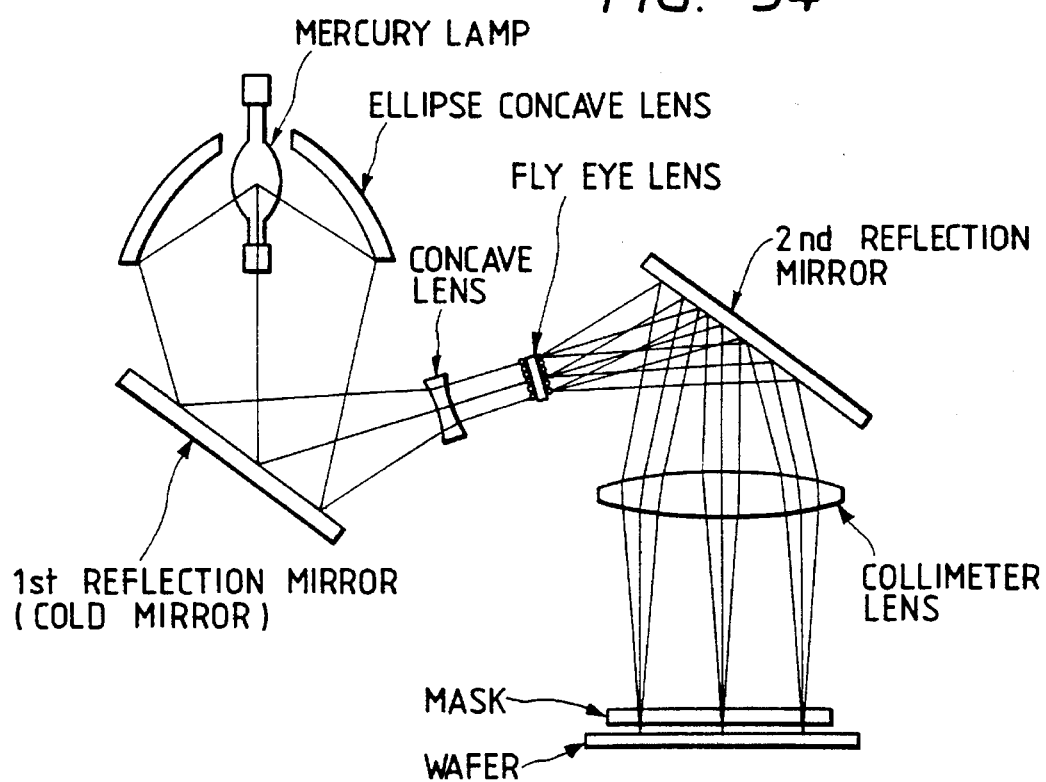
FIG. 34 shows one example of proximity and contact exposure devices.

In this embodiment, the reflection projection exposure device is used. However, proximity or contact exposure device may also be used. FIG. 34 shows one example of the proximity and contact exposure device.

As will be understood from the foregoing description, in the present invention, circuit patterns are projected on the same semiconductor substrate in a joined fashion using the reduction projection exposure device. Therefore, the present invention has the following advantages:

1. It is possible to manufacture IC chips having a chip size larger than the field size of the reduction projection exposure device.
2. It is possible to form the patterns in a IC chip on a submicron rule. An alignment accuracy of $3\sigma=0.2$ μm or less can be achieved between the adjacent IC chip fabrication steps.
3. Manufacture of large-area and highly integrated ICs is made possible without increasing production costs.

Furthermore, since the circuit patterns are projected in a state where they are sequentially connected with each other, the area of the pattern can be increased in proportion to the number of exposure processes and is not limited to the field size of the reduction projection exposure device.

Furthermore, since the overlapping portion is provided between the patterns, even when the patterns are not connected properly, occurrence of failures, such as disconnection of the patterns or separation disability, can be reduced.

Furthermore, a combination of a plurality of separate ICs can be fabricated into a single IC. Therefore, production cost can be reduced, and reliability of the manufactured ICs can be improved.

Furthermore, the connecting portion of the patterns exists in the device separating area or non device forming area. It is therefore possible to prevent deterioration in the characteristics of the semiconductor devices or reduction in the yield.

Throughput can be improved and reduction in the production cost can be achieved by adequately selecting the exposure method.

What is claimed is:

1. A semiconductor device comprising a plurality of elements, said semiconductor device manufactured by a method of manufacturing semiconductor devices in which a desired pattern having a size larger than the field size that can be projected in one exposure process step of a reduction projection type exposure device is formed on a semiconductor substrate by repeating the process of projecting a circuit pattern on the semiconductor substrate using the reduction projection type exposure device while sequentially connecting at a connecting portion the projected patterns with each other, wherein at least part of the connecting portion is disposed in a device separating area at which said plurality of elements of said semiconductor device separated from each other.

2. The semiconductor device according to claim 1, wherein said plurality of elements comprise a plurality of photoelectric conversion elements.

3. The semiconductor device according to claim 1, wherein the device separating area comprises a collector area of a bipolar transistor of said plurality of elements.

4. The semiconductor device according to claim 2, wherein the device separating area comprises a collector area of a bipolar transistor of said plurality of photoelectric conversion elements.

* * * * *

UNITED STATES PATENT AND TRADEMARK OFFICE
CERTIFICATE OF CORRECTION

PATENT NO. : 5,561,317

DATED : October 1, 1996

INVENTORS : GENZO MOMMA ET AL.

It is certified that error appears in the above-identified patent and that said Letters Patent is hereby corrected as shown below:

COLUMN 1

Line 18, "Barkground" should read --Background--.

COLUMN 4

Line 3, "show" should read --shows--.

COLUMN 6

Line 48, "alighment" should read --alignment--.

COLUMN 7

Line 20, "limited" should read --limited to--.

COLUMN 8

Line 24, "Providion" should read --Provision--;
Line 48, "region." should read --region--.

COLUMN 9

Line 53, "the-resolution" should read --the resolution--.

UNITED STATES PATENT AND TRADEMARK OFFICE
CERTIFICATE OF CORRECTION

PATENT NO. : 5,561,317

DATED : October 1, 1996

INVENTORS : GENZO MOMMA ET AL.

It is certified that error appears in the above-identified patent and that said Letters Patent is hereby corrected as shown below:

COLUMN 10

Line 28, "that" should read --that of--.

COLUMN 13

Line 3, "Function" should read --Function,--.

COLUMN 16

Line 8, "separated" should read --are separated.--

Signed and Sealed this

Eighteenth Day of March, 1997

BRUCE LEHMAN

Attest:

Attesting Officer

Commissioner of Patents and Trademarks